US008928428B2

(12) United States Patent
Gorbachov

(10) Patent No.: US 8,928,428 B2
(45) Date of Patent: Jan. 6, 2015

(54) ON-DIE RADIO FREQUENCY DIRECTIONAL COUPLER

(75) Inventor: Oleksandr Gorbachov, Irvine, CA (US)

(73) Assignee: RFaxis, Inc., Irvine, CA (US)

( * ) Notice: Subject to any disclaimer, the term of this patent is extended or adjusted under 35 U.S.C. 154(b) by 507 days.

(21) Appl. No.: 13/333,706

(22) Filed: Dec. 21, 2011

(65) Prior Publication Data

US 2012/0161898 A1 Jun. 28, 2012

Related U.S. Application Data

(60) Provisional application No. 61/426,274, filed on Dec. 22, 2010.

(51) Int. Cl.
*H01P 5/18* (2006.01)
*H03H 7/38* (2006.01)

(52) U.S. Cl.
CPC .................................... *H01P 5/185* (2013.01)
USPC ........................................ 333/109; 333/112

(58) Field of Classification Search
CPC .................................. H01P 5/18; H03H 7/18
USPC .................. 333/109, 110, 111, 112, 116, 118
See application file for complete search history.

(56) References Cited

U.S. PATENT DOCUMENTS 5,382,925 A 1/1995 Hayashi et al.
6,108,313 A 8/2000 Lee et al.
6,937,845 B2 8/2005 Watanabe et al.
6,977,552 B2 12/2005 Macedo
7,315,730 B2 1/2008 Galan
7,394,333 B2 * 7/2008 Ezzeddine et al. ............ 333/109
7,623,006 B2 * 11/2009 Ezzeddine et al. ............ 333/131
8,005,504 B2 8/2011 Sano et al.
2004/0209584 A1 10/2004 Bargroff et al.
2005/0122185 A1 6/2005 Podell
2006/0045202 A1 3/2006 Rafi et al.
2006/0068730 A1 3/2006 Khorram
2007/0222697 A1 9/2007 Caimi et al.
2007/0232241 A1 10/2007 Carley et al.
2008/0089252 A1 4/2008 Choi
2008/0159458 A1 7/2008 Cheng et al.
2008/0279262 A1 11/2008 Shanjani
2008/0297272 A1 12/2008 Toujo et al.
2009/0009260 A1 1/2009 Gorbachov
2009/0036065 A1 2/2009 Siu (Continued)

FOREIGN PATENT DOCUMENTS

WO 2008/002697 3/2008

OTHER PUBLICATIONS

PCT/US2011/066855; International Search Report Written Opinion dated Jun. 28, 2012; 10 pages.

*Primary Examiner* — Dean Takaoka
(74) *Attorney, Agent, or Firm* — Stetina Brunda Garred & Brucker

(57) ABSTRACT

A directional coupler with increased directivity is disclosed. There is an input port, an output port, a coupled port, and a ballasting port. A first transmission element has a first connection to the input port and a second connection to the output port, and a second transmission element has a first connection to the coupled port and a second connection to the ballasting port. A first compensation capacitor is connected to the input port and the coupled port, and a second compensation capacitor is connected to the input port and the ballasting port.

24 Claims, 26 Drawing Sheets

(56) References Cited

U.S. PATENT DOCUMENTS

2009/0167627 A1 7/2009 Breiter
2009/0206945 A1 8/2009 Wagner et al.
2009/0207764 A1 8/2009 Fukamachi et al.

* cited by examiner

ON-DIE RADIO FREQUENCY DIRECTIONAL COUPLER

CROSS-REFERENCE TO RELATED APPLICATIONS

This application relates to and claims the benefit of U.S. Provisional Application No. 61/426,274, filed Dec. 22, 2010 and entitled ON-DIE RF DIRECTIONAL COUPLER, which is wholly incorporated by reference herein.

STATEMENT RE: FEDERALLY SPONSORED RESEARCH/DEVELOPMENT

Not Applicable

BACKGROUND

1. Technical Field

The present disclosure relates radio frequency (RF) circuit components, and more particularly, to an on-die RF directional coupler.

2. Related Art

Directional couplers are passive devices utilized to couple a part of the transmission power on one signal path to another signal path by a predefined amount. Conventionally, this is achieved by placing the two signal paths in close physical proximity to each other, such that the energy passing through one is passed to the other. This property is useful for a number of different applications, including power monitoring and control, testing and measurements, and so forth.

The directional coupler is a four-port device including an input port (P1), an output port (P2), a coupled port (P3), and an isolated or ballast port (P4). The power supplied to P1 is coupled to P3 according to a coupling factor that defines the fraction of the input power that is passed to P3. The remainder of the power on P1 is delivered to P2, and in an ideal case, no power is delivered to P4. The degree to which the forward and backward waves are isolated is the directivity of the coupler, and again, in an ideal case, would be infinite. Directivity may also be defined as the difference between S31 (coupling coefficient) and S32 (reverse isolation). In an actual implementation, however, some level of the signal is passed to both to P3 and P4, though the addition of a ballasting resistor to P4 may be able to dissipate some of the power.

The type of transmission lines utilized in such conventional directional couplers includes coaxial lines, strip lines, and micro strip lines. The geometric dimensions are proportional to the wavelength of transmitted signal for a given coupling coefficient. Directional couplers utilizing lumped element components are known in the art, but such devices are also dimensionally large. These devices are implemented with ceramic substrates and thin-film printed metal traces, and have footprints of 2×1.6 mm and 1.6×0.8 mm and above, which is much larger than semiconductor die implementations. Notwithstanding the relatively large physical coupling area of the transmission lines, such directional couplers only have a directivity of around 10 dB. The resultant power control accuracy is approximately +/−0.45 dB. Such performance is unsuitable for many applications including mobile communications, where high voltage standing wave ratios (VSWR) at the antenna are possible.

Instead of lumped element circuits, directional couplers may be based on integrated passive devices (IPD) technology and implemented on wafer level chip scale packaging (WL-CSP). Due to the footprint restrictions, implementation of directional couplers on semiconductor dies is generally limited to microwave and millimeter wave operating frequencies. These types of directional couplers utilize two coupled inductors. Although suitable for on-die implementations, such couplers exhibit low levels of directivity due to the small geometric dimensions. With a mismatch on the output port (P2), the reflect signal may leak to the coupled port (P3) and mix with the originally coupled signal, thereby resulting in a high level of uncertainly in measurements of transferred power to the output port P2. Even with higher coupling coefficients possible with increasing the number of turns in inter-wound micro strip line coupled inductors, directivity remains low.

An improvement over the basic coupled inductor architecture is disclosed in U.S. Pat. No. 7,446,626. In addition to the coupled inductors, there is a compensation capacitor and a compensation resistor that are understood to provide a high level of directivity (around 60 db) notwithstanding the small geometry. With the use of low inductance values, low insertion loss resulted. However, there are several deficiencies with such earlier directional couplers. The lumped element capacitors utilized therein are only capable of sustaining a limited voltage level. In typical metal-insulator-metal (MIM) capacitors, the breakdown voltage ranges from 5V to 30V, depending on the particular semiconductor technology utilized. Conventional techniques for increasing capacitive density involve reducing the thickness of the dielectric between the metal plates to several hundred angstroms, and though the footprint is reduced, so is the breakdown voltage. The use of the aforementioned compensation resistor for achieving high directivity across a wide frequency range is also problematic in that a more expensive semiconductor process must be utilized. It is possible in some instances to exclude the compensation resistor, but this results in reduced directivity.

Therefore, there is a need in the art for an improved RF directional coupler capable of high operating voltages, high directivity, and low insertion loss and implemented on lower cost semiconductor technologies.

BRIEF SUMMARY

In accordance with one embodiment of the present disclosure, there is contemplated a directional coupler with increased directivity. As with any directional coupler, there may be an input port, an output port, a coupled port, and a ballasting port. There may also be a first transmission element having a first connection to the input port and a second connection to the output port, as well as a second transmission element having a first connection to the coupled port and a second connection to the ballasting port. The directional coupler may further include a first compensation capacitor that can be connected to the input port and the coupled port, in addition to a second compensation capacitor that can be connected to the input port and the ballasting port. The first transmission element and the second transmission element may be inductors, and the first transmission element may be inductively coupled to the second transmission element by a predefined coupling factor. The coupled port may be isolated from the input port by a predefined second isolation factor.

Another embodiment of the directional coupler is contemplated. Again, there may be an input port, an output port, a coupled port, and a ballasting port. Additionally, there may be a dielectric layer. The directional coupler may be physically implemented as two coupled inductors, with the compensation capacitors corresponding to the capacitive coupling between two coupled inductors. Thus, there may be a first spiral conductive trace that is disposed on the dielectric layer, and having a first predefined width and a first predefined thickness. The first spiral conductive trace may also be defined by an outer terminus, a plurality of successively inward turns, and an inner terminus. Furthermore, there may be a second spiral conductive trace that is disposed on the dielectric layer, and may be in an interlocking, spaced coplanar relationship with the first conductive trace. The second spiral conductive trace may therefore be inductively coupled to the first spiral conductive trace. Like the first spiral conductive trace, the second spiral conductive trace may have a corresponding second predefined width and a second predefined thickness, and further defined by an outer terminus, a plurality of successively inward turns, and an inner terminus.

The directional coupler may further include a first underpath that is formed on the dielectric layer and connects the inner terminus of the second spiral conductive trace to the ballasting port. There may also be a second underpath formed on the dielectric layer that connects the inner terminus of the first spiral conductive trace to the output port. Accordingly, the first underpath may be capacitively coupled to at least one of the first spiral conductive trace and the second spiral conductive trace, and the second underpath may be capacitively coupled to at least one of the first spiral conductive trace and the second spiral conductive trace.

High levels of directivity can be achieved at least in part due to the inductive and capacitive coupling between the two spiral conductive traces. Moreover, because separate capacitors, whether lumped element or stub-based, need not be incorporated, the overall footprint and the costs of production can be minimized while also beneficially increasing the power level limits. The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The detailed description set forth below in connection with the appended drawings is intended as a description of the presently preferred embodiments of a radio frequency (RF) directional coupler, and is not intended to represent the only form in which the present invention may be developed or utilized. The description sets forth the functions of the invention in connection with the illustrated embodiment. It is to be understood, however, that the same or equivalent functions may be accomplished by different embodiments that are also intended to be encompassed within the scope of the invention. It is further understood that the use of relational terms such as first and second and the like are used solely to distinguish one from another entity without necessarily requiring or implying any actual such relationship or order between such entities.

There are several performance objectives that are applicable to RF directional couplers, including high directivity, high power levels, low insertion loss, and low sensitivity to variations in other connected electrical components. Various embodiments of the present disclosure contemplate directional couplers that meet these objectives as explained in more detail below, and further have additional practical advantageous characteristics such as decreased size, and simplified, low-cost implementation, among others.

Figure 1:
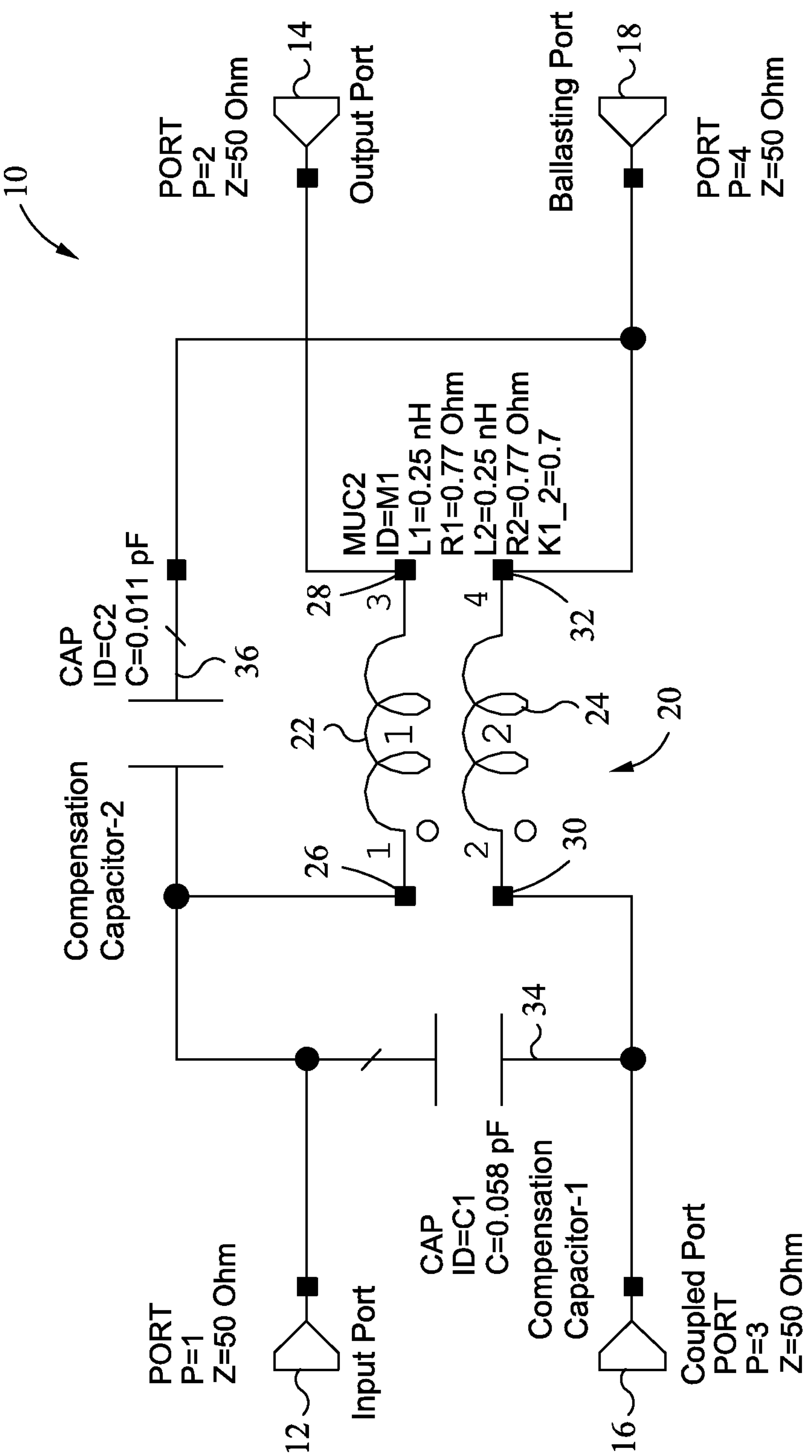
FIG. 1 is a schematic diagram illustrating a directional coupler in accordance with the present disclosure.

With reference to the schematic diagram of FIG. 1, one embodiment of such a directional coupler 10 has an input port 12, an output port 14, a coupled port 16, and a ballasting port 18. As described above, for a directional coupler in the general case, a portion of the signal that is applied to the input port 12 is passed through to the output port 14, and another portion of the same is passed to the coupled port 16. Although in an ideal case, the signal is not passed to the ballasting port 18, in a typical implementation, at least a minimal signal level is present. For purposes of discussing and graphically illustrating the scattering parameters (S-Parameters) of the four-port device that is the directional coupler 10, the input port 12 may be referred to as port P1, the output port 14 may be referred to as port P2, the coupled port 16 may be referred to as port P3, and the ballasting port 18 may be referred to as port P4. Each of the ports is understood to have a characteristic impedance of 50 Ohm for standard matching of components.

Notwithstanding the foregoing naming conventions of the various ports of the directional coupler, it is possible to apply a signal to the port P3 (coupled port 16) that is passed to port P4 (ballasting port 18), with a portion thereof being passed to the port P1 (input port P12) and minimized at the port P2 (output port 14). In other words, the ports P1 and P2 are functionally reciprocal with the ports P3 and P4. It is understood, however, that directivity may be different between when the signal is applied to port P1 versus when the signal is applied to port P3. Although not entirely symmetric, in both cases there is contemplated to be sufficient directivity for most applications. Along these lines, the port P2 can be utilized as the input port while port P1 can be utilized as the output port. According to such use, it follows that the port P4 is the coupled port and the port P3 is the ballasting port. Another configuration where the port P4 is utilized as the input port, then the output port will be the port P3, while the port P2 will be the coupled port and the port P1 will be the ballasting port. The loss between port P1 and port P2, and the loss between port P3 and port P4 may be different if the widths and thicknesses of the conductive traces of the directional coupler 10, discussed in greater detail below, are different.

The directional coupler 10 further includes coupled inductors 20 that are comprised of a first transmission element 22 and a second transmission element 24. The first transmission element 22 and the second transmission element 24 may also be referred to individually as inductors. Additional details pertaining to the physical implementation of such inductors and how the individual transmission elements are inductively coupled will be discussed more fully below. The first transmission element 22 has a first connection 26 to the input port 12 and a second connection 28 to the output port 14. Furthermore, the second transmission element 24 has another first connection 30 to the coupled port 16 and another second connection 32 to the ballasting port 18. By way of example only and not of limitation, the first transmission element 22 or inductor, as well as the second transmission element 24 or inductor, have inductance values of 0.25 nH, and a resistance of 0.77 Ohm.

In accordance with various embodiments of the present disclosure, the directional coupler 10 includes a first compensation capacitor 34 that is connected to the input port 12 and the coupled port 16, in addition to a second compensation capacitor 36 that is connected to the input port 12 and the ballasting port 18. The first compensation capacitor 34 may have a capacitance value of, for example, 0.058 pF, while the second compensation capacitor 36 may have a capacitance value of 0.11 pF.

Figure 2:
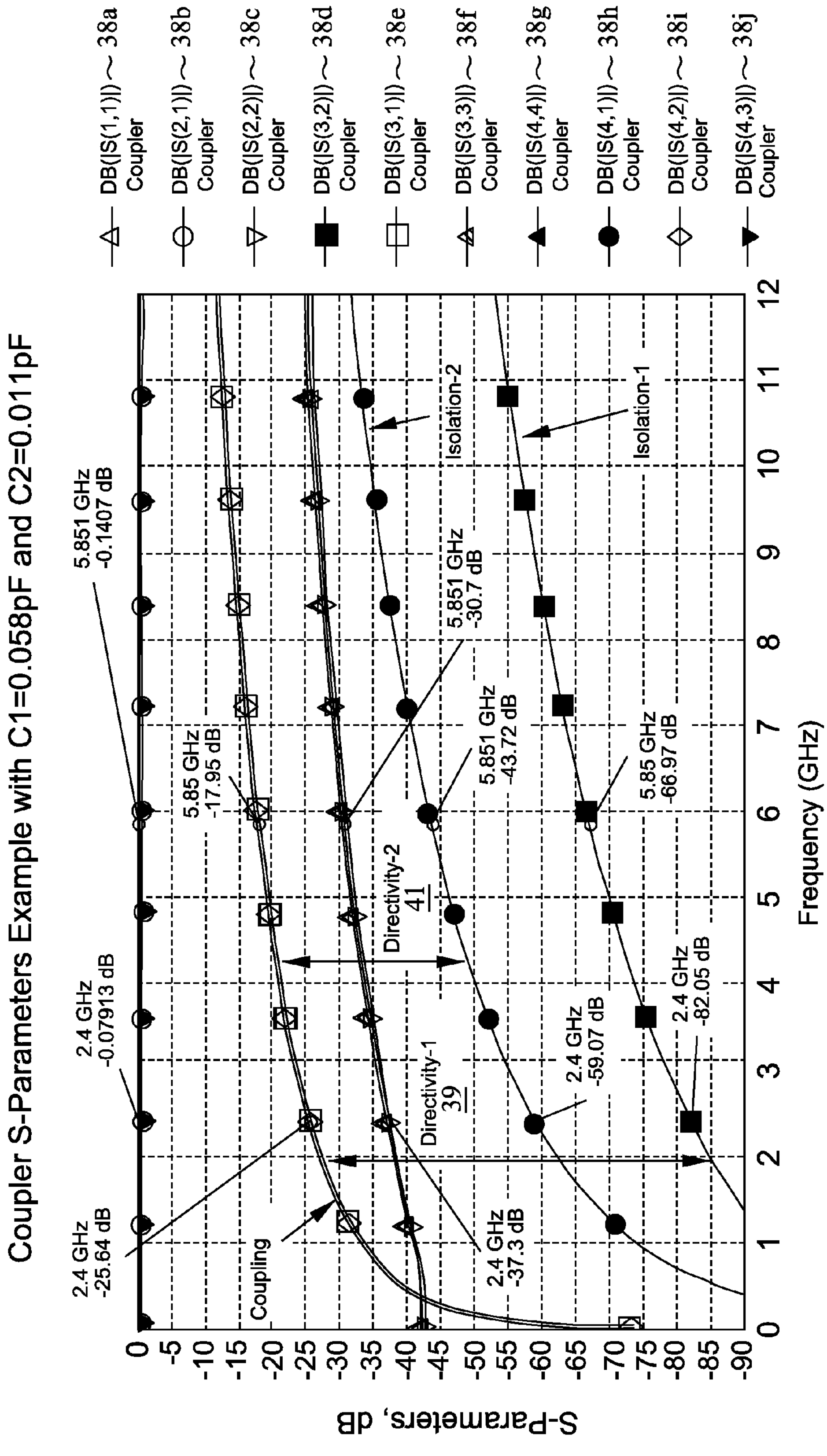
FIG. 2 is a graph showing the scattering parameters (S-parameters) of the directional coupler shown in FIG. 1 over an operating frequency range, with the coupling factor, first and second isolation factors, and resultant first and second directivity being detailed.

With reference to the graph of FIG. 2, given the four-port configuration of the directional coupler 10, the electrical behavior thereof in response to a steady-state input can be described by a set of scattering parameters (S-parameters). As pertinent to the operational characteristics of the directional coupler 10, the first transmission element 22 and the second transmission element 24 may be characterized by a predefined coupling factor, that is, the degree to which the signal on the first transmission element 22 is passed or coupled to the second transmission element 24. The coupling factor corresponds to S31, or the gain coefficient between the input port 12 (P1) and the coupled port 16 (P3). This is shown in a fifth plot 38*e*. Additionally, the coupled inductors 20 are also characterized by a predefined first isolation factor between the first connection 26 of the first transmission element 22 and the second connection 28 of the second transmission element 24, that is, between the input port 12 and the coupled port 16. The first isolation factor corresponds to S32 shown as a fourth plot 38*d*, and is the gain coefficient between the output port 14 (P2) and the coupled port 16 (P3). The coupled inductors 20 are further characterized by a predefined second isolation factor between the first connection 26 of the first transmission element 22 and the second connection 32 of the second transmission element 24. More generally, this refers to the degree of isolation between the input port 12 and the ballasting port 18. The predefined second isolation factor corresponds to S41 shown as an eighth plot 38*h*, and is the gain coefficient between the input port 12 (P1) and the ballasting port 18 (P4). The remainder of the plots of the graph shown in FIG. 2 includes a first plot 38*a* describing the input port reflection coefficient S11, a second plot 38*b* describing the input port-output port gain coefficient S21, a third plot 38*c* describing the output port reflection coefficient S22, a sixth plot 38*f* describing the coupled port 16 reflection coefficient S33, a seventh plot 38*g* describing the ballasting port 18 reflection coefficient S44, a ninth plot 38*i* describing the output port-ballasting port gain (coupling) coefficient S42, and a tenth plot 38*j* describing the coupling port-ballasting port gain coefficient S43.

Figure 3:
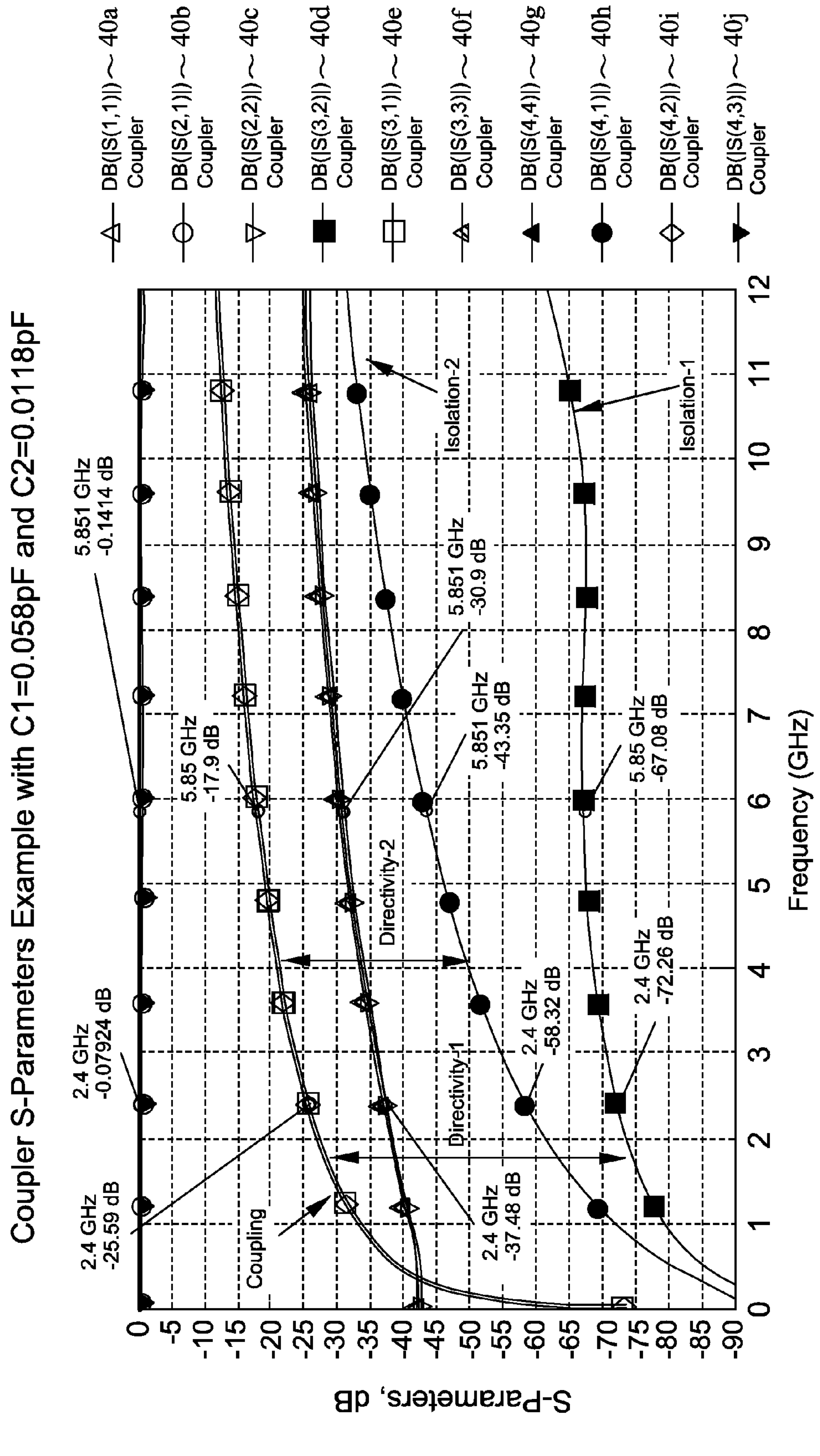
FIG. 3 is a graph showing the S-parameters of the directional coupler with the value of a second compensation capacitor being slightly adjusted, illustrating the performance variations based on such adjustment.

The difference between the coupling factors at particular operating frequencies, and the corresponding first and second isolation factors at such operating frequencies, respectively define a first directivity 39 and a second directivity 41. As indicated above, the first directivity is different from the second directivity, that is, the directional coupler 10 is asymmetric. It is contemplated that the high directivity of the directional coupler 10 attributable to the first compensation capacitor 34 and the second compensation capacitor 36. The capacitance values may be further optimized for increased directivity across a wide operating frequency range. The adjustment of the first compensation capacitor is understood to affect the second directivity, while the adjustment of the second compensation capacitor 36 is understood to affect the first directivity. The graph of FIG. 3 illustrates a simulated example of the first compensation capacitor 34 with a value of 0.058 pF, and the second compensation capacitor 36 with a value of 0.118 pF. Each of the aforementioned S-parameters discussed in relation to the graph of FIG. 3 are correspondingly shown as plots 40*a*-40*j*. As expected, the first isolation factor (and hence the first directivity) is affected, with greater isolation across a wider operating frequency spectrum being exhibited.

Figure 4:
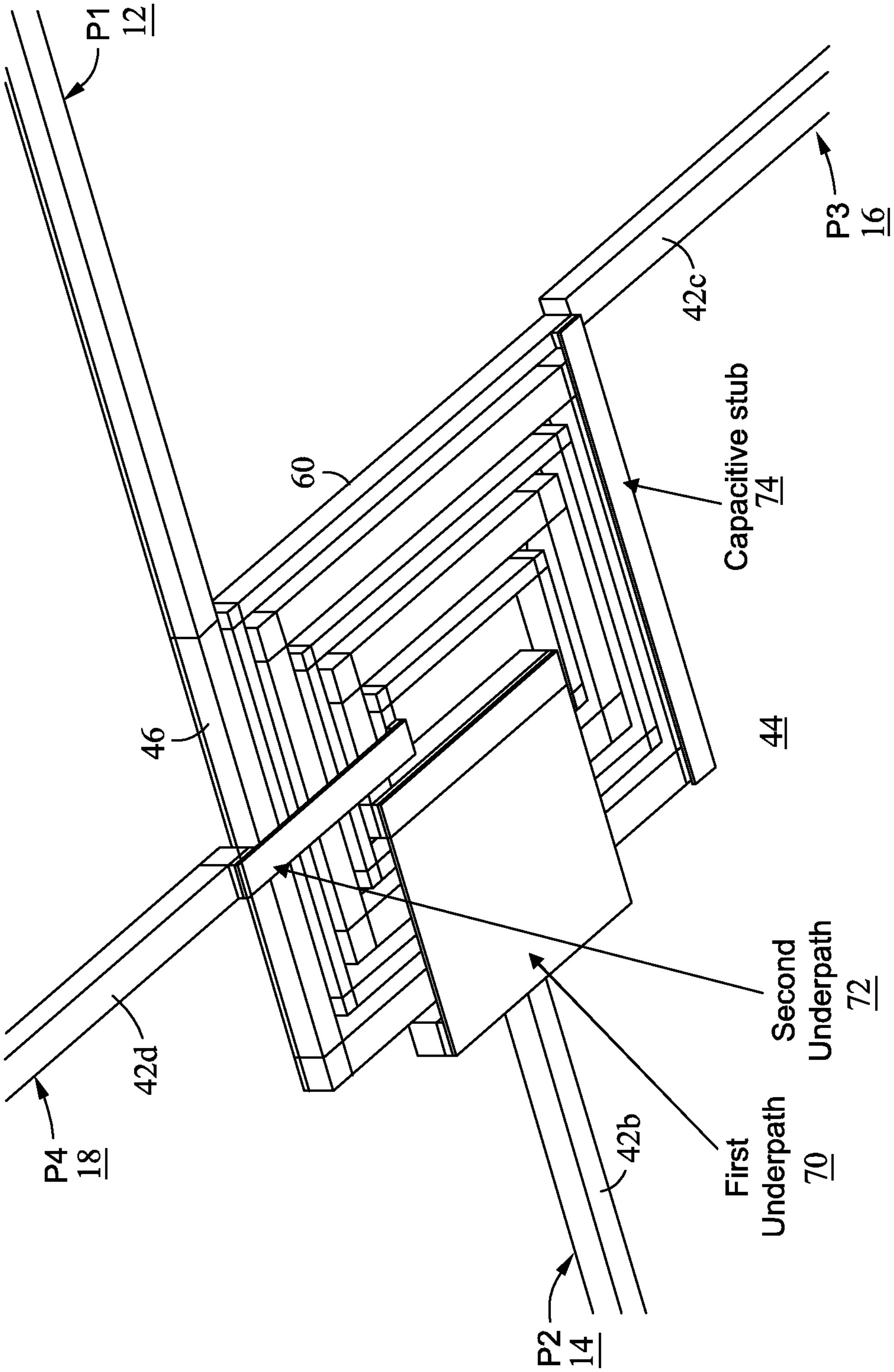
FIG. 4 is a perspective view of a first embodiment of the directional coupler implemented with conductive traces.

Referring now to FIG. 4, there is shown a perspective view of a first embodiment of the directional coupler 10*a*, which implements the various components discussed above as conductive traces with a particular geometry, size, and overall footprint Like the schematic-level depiction, the first embodiment of the directional coupler 10*a* includes the input port 12 (P1), the output port 14 (P2), the coupled port 16 (P3), and the ballasting port 18 (P4). Each of these ports is understood to be the ends of respective connective traces 42*a*-42*d* that may be connection points from another component. The connective traces 42 are shown by way of example only, and are generally understood to be a part of the respective ports P1-P4. Thus, the term port may refer to any conductive element that serves as an interface of the directional coupler 10 to outside electrical component connections.

Conductive elements of the directional coupler 10*a* are disposed on a dielectric layer 44, which may be a part of a semiconductor substrate. Alternative substrate materials such as low temperature co-fired ceramic (LTCC) and thin-film printed substrates are also possible. Those having ordinary skill in the art will recognize that the directional couplers 10 may be fabricated on any suitable dielectric material upon which a conductive path may be disposed. Along these lines, the conductive path may be formed of any electrically conductive material such as metal.

Figure 5:
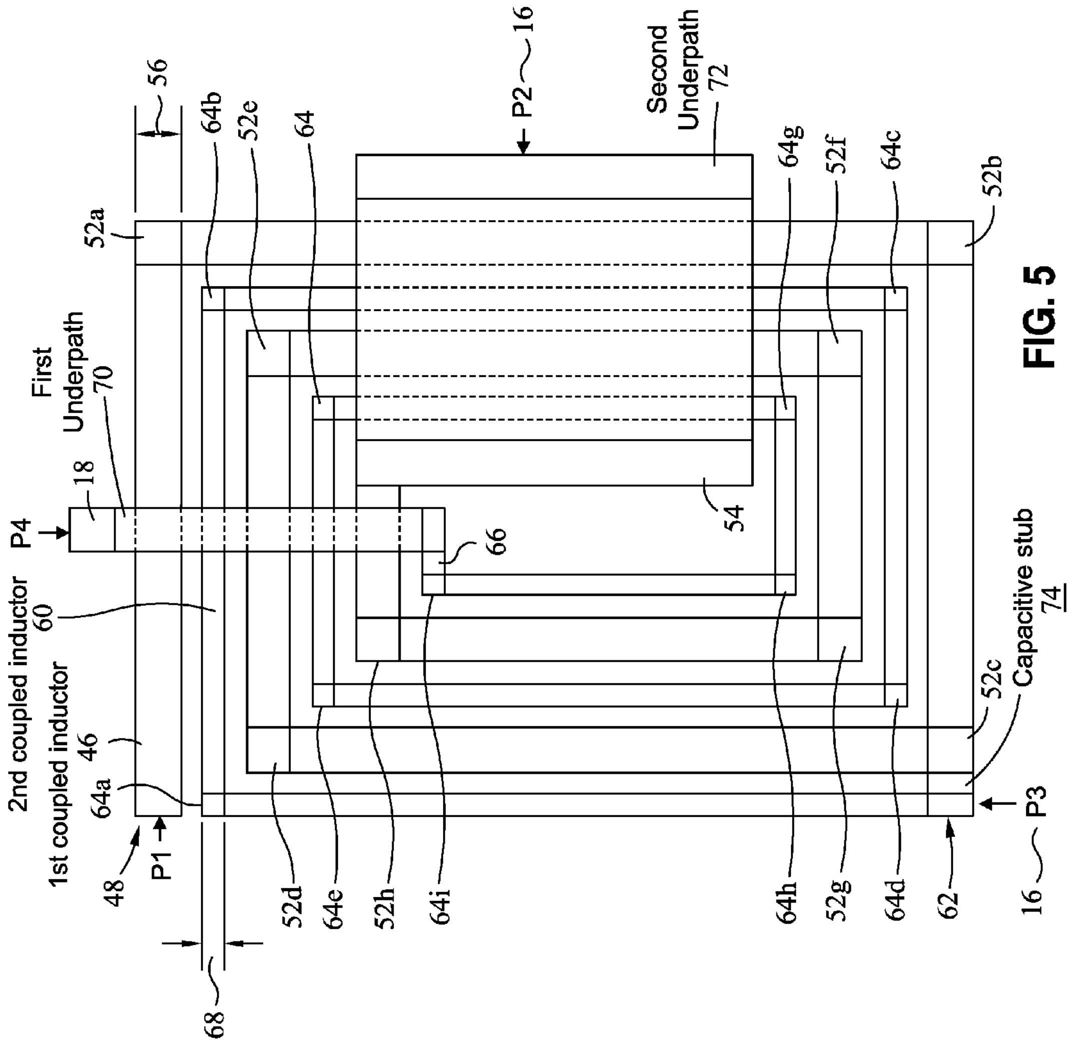
FIG. 5 is a plan view of the first embodiment of the directional coupler shown in FIG. 4.

As also shown in FIG. 5, the directional coupler 10*a* includes a first spiral conductive trace 46 that corresponds to the schematic-level first transmission element 22 from FIG. 1. In this regard, it is intended for the first spiral conductive trace 46 to be dedicated to the main RF signal path. The first spiral conductive trace 46 has an outer terminus 48, a plurality of successive inward turns 52*a*-52*i*, and an inner terminus 54. Although depicted and described in terms of specific perpendicular turns 52, it will be recognized that the first spiral conductive trace 46 may instead be defined by a plurality of oblique angle turns, or circular turns, or another otherwise spiral configuration. Throughout its entire length, the first spiral conductive trace 46 defines a first width 56. In accordance with one embodiment of the present disclosure, the first width 56 is 5 μm. Additionally, as best illustrated in the perspective view of FIG. 4, the first spiral conductive trace 46 defines a thickness 58, which may be 3 μm.

There is also a second spiral conductive trace 60 that corresponds to the second transmission element 24, and is connected to the coupled port 16 and the ballasting port 18. The second spiral conductive trace 60 is disposed on the dielectric layer 44 in an interlocking, spaced coplanar relationship with the first spiral conductive trace 46, and is inductively coupled thereto. More particularly, the second spiral conductive trace 60 is defined by an outer terminus 62, a plurality of successive inward turns 64, and an inner terminus 66. The spacing between any given point on the second spiral conductive trace 60 and the first spiral conductive trace 46 is constant, so the shape and configuration of the second spiral conductive trace 60 is similar to that of the first spiral conductive trace 46. Accordingly, to the extent that the turns 52 of the first spiral conductive trace 46 is different than the illustrated perpendicular configuration, the turns 64 of the second spiral conductive trace 60 are understood to have such an alternative configuration. In one exemplary embodiment, the spacing between the spiral conductive traces 48, 60 is 2.5 μm.

Also throughout its entire length, the second spiral conductive trace 60 defines a second width 68. Relative to the first spiral conductive trace 46, the second width 68 is narrower, at 2.5 μm. It is understood that the second spiral conductive trace 60 is dedicated for the coupled RF signal path, and accordingly the signal level is lower, thus only a narrower conductor is utilized. The first spiral conductive trace 46 and the second spiral conductive trace 60 are understood to be coplanar, and accordingly have the same thickness 58 of 3 μm. Together with the first spiral conductive trace 46 and the second spiral conductive trace 60, the overall dimensions in one exemplary embodiment is 102.5 μm×75 μm.

In order to connect the first spiral conductive trace 46 and the second spiral conductive trace 60 to the respective one of the coupled port 16 and the ballasting port 18, the directional coupler 10*a* includes underpaths. Specifically, there is a first underpath 70 formed on the dielectric layer 44 and connected to the inner terminus 66 of the second spiral conductive trace 60, as well as the ballasting port 18. As the first underpath 70 extends in a perpendicular relationship to the various winding sections of the first and second spiral conductive traces 46, 60, it is not coplanar therewith. Instead, the first underpath 70 is disposed underneath the first and second spiral conductive traces 48, 60. There is also a second underpath 72 formed on the dielectric layer 44 and connected to the inner terminus 54 of the first spiral conductive trace 46 and the coupled port 16. The second underpath 72 is understood to be coplanar with the first underpath 70. The thickness of the dielectric layer 44 between the spiral conductive traces 46, 60 and the underpaths 70, 72 may be varied within a wide range. In one exemplary configuration, the silicon semiconductor substrate may be 100 μm. Based upon this configuration, the first underpath 70 may be capacitively coupled to at least one of the first spiral conductive trace 46 and the second spiral conductive trace 60. Likewise, the second underpath 72 may be similarly capacitively coupled to at least one of the first spiral conductive trace 46 and the second spiral conductive trace 60.

According to another aspect of the present disclosure, the directional coupler 10*a* may further include one or more conductive circuit elements disposed on the dielectric layer 44 for increasing the capacitive coupling of the first spiral conductive trace 46 to the second spiral conductive trace 60. In this regard, the conductive circuit element may be a capacitive stub 74 that is electrically connected to the coupled port 16 and extends in a spaced parallel relationship to at least one part of the first spiral conductive trace 46. The capacitive stub 74 is disposed on the same plane as the first and second underpaths 70, 72. Referring back additionally to the schematic diagram of FIG. 1, the capacitive stub 74 is understood to correspond to the first compensation capacitor 34.

Figure 6:
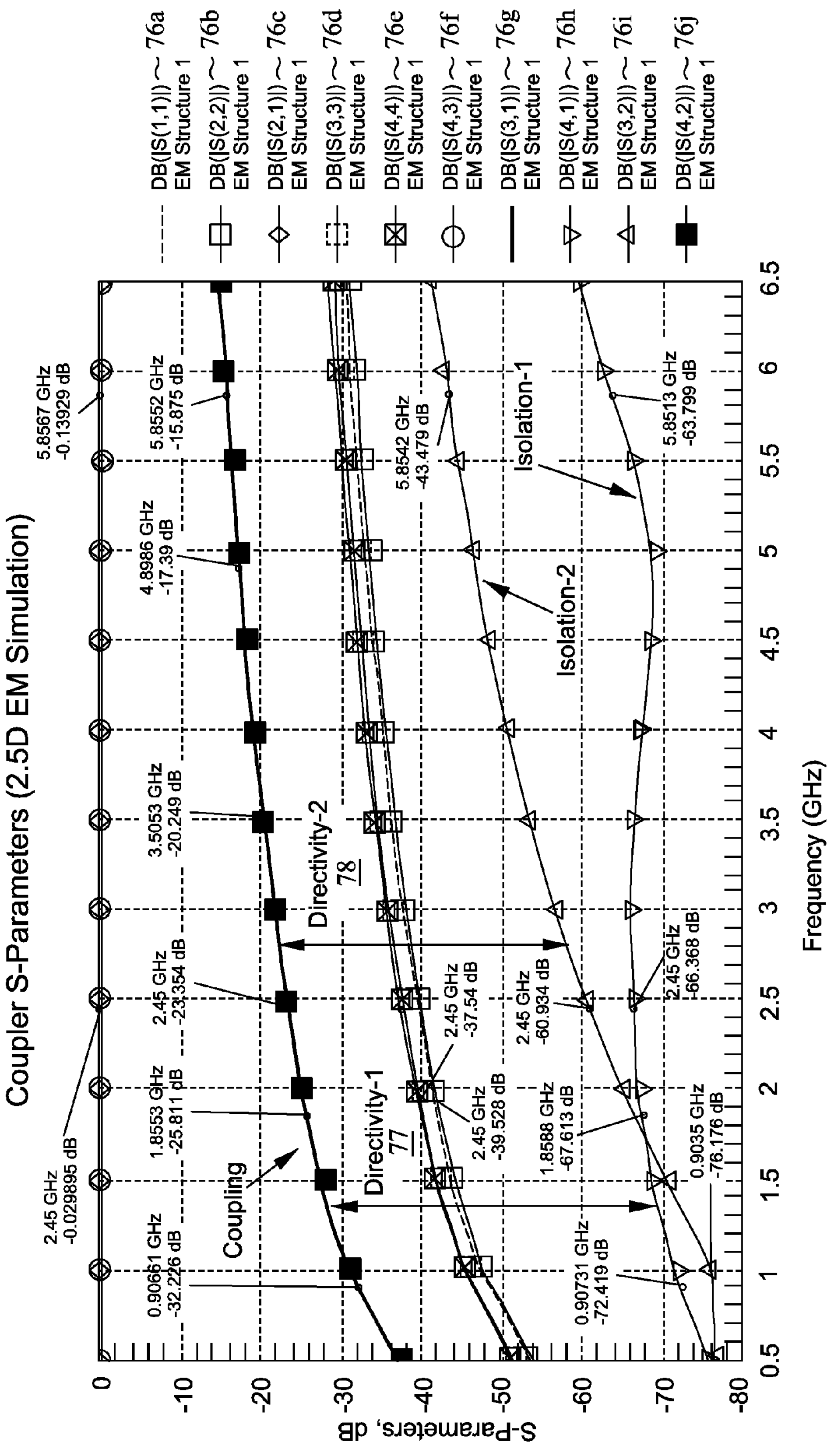
FIG. 6 is a graph of the S-parameters of the first embodiment of the directional coupler.

As indicated above, the directional coupler 10*a* exhibit simultaneous inductive and capacitive coupling between the first spiral conductive trace 46 and the second spiral conductive trace 60 by way of the first and second underpaths 70, 72, and the capacitive stub 74. It is not necessary to implement the capacitors and resistors as separate components from the directional coupler 10*a*, since they can be implemented only with the various conductive traces. This additional capacitive and inductive coupling is understood to improve directivity, as will be illustrated with reference to the graph of FIG. 6, which shows the simulated S-parameters of the directional coupler 10*a*. Each of the aforementioned S-parameters discussed in relation to the graph of FIG. 3 are correspondingly shown as plots 76*a*-76*j*. Having been so discussed, the specific name of the S-parameters and the performance characteristics represented thereby will not be repeated. Generally, it can be seen that a first directivity 77 and the second directivity 78 are similar to the earlier mentioned first directivity 39 and the second directivity 41, respectively.

Figure 7:
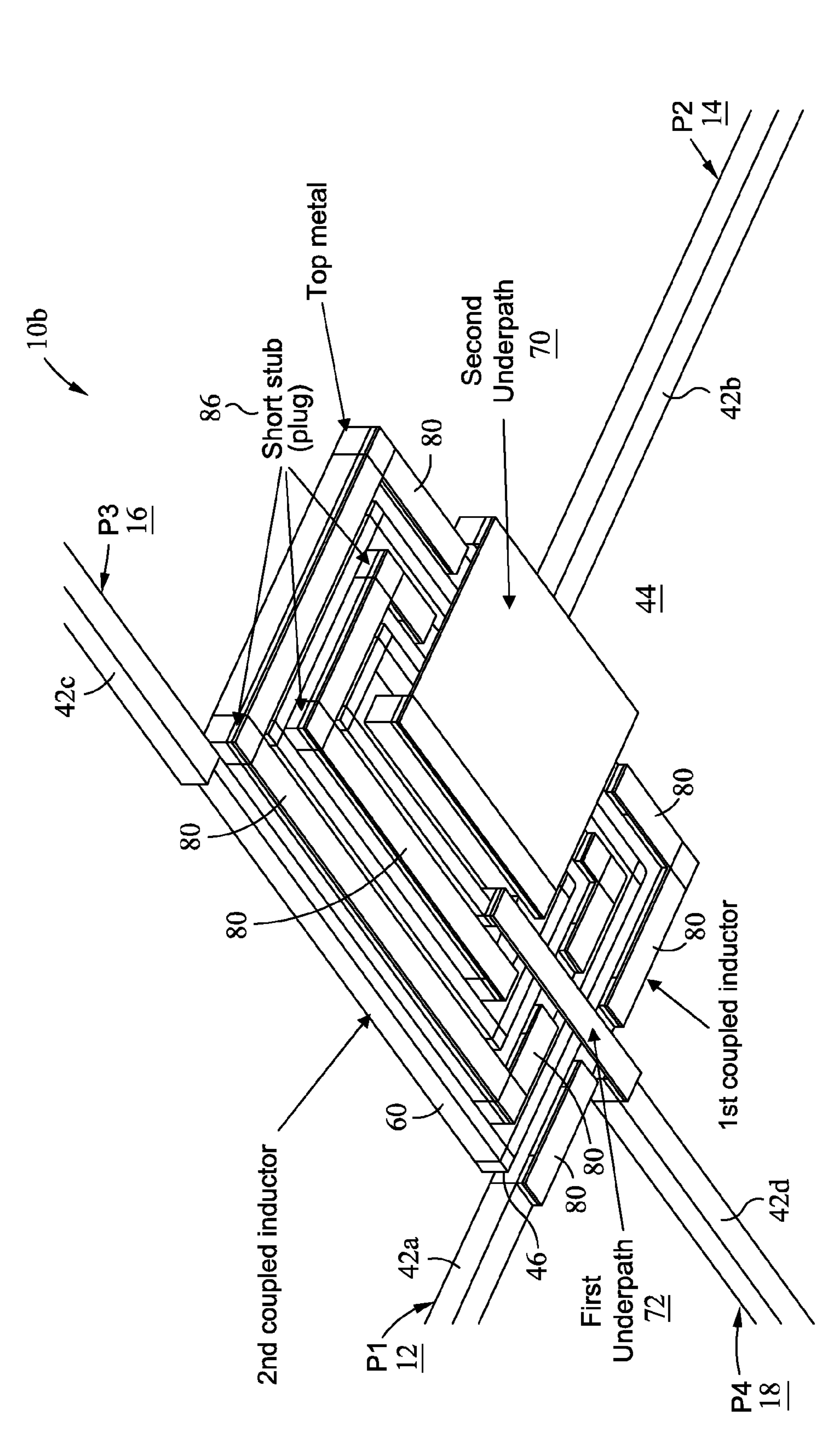
FIG. 7 is a perspective view of a second embodiment of the directional coupler.

In a second embodiment of the directional coupler 10*b* shown in FIG. 7, the conductive circuit element disposed on the dielectric layer 44 for increasing the capacitive coupling of the first spiral conductive trace 46 to the second spiral conductive trace 60 may be secondary traces 80. As with the first embodiment 10*a*, the second embodiment includes the input port 12 (P1), the output port 14 (P2), the coupled port 16 (P3), and the ballasting port 18 (P4). Each of these ports is understood to be the ends of respective connective traces 42*a*-42*d* that may be connection points from another component. Furthermore there is the first spiral conductive trace 46 in an interlocking, coplanar relationship with the second spiral conductive trace 60, both having the same general shape discussed above. The dimensions are also the same, including the overall footprint of 102.5×75 μm, the width of the first spiral conductive trace 46 of 5 μm the width of the second spiral conductive trace 60 of 2.5 μm, and the constant offset or separation between the first spiral conductive trace 46 and the second spiral conductive trace 60 of 2.5 μm. The thickness of both the first spiral conductive trace 46 and the second spiral conductive trace 60 is contemplated to be 3 μm. The second embodiment 10*b* also includes the first underpath 70 as well as the second underpath, connected to the respective output port 14, and ballasting port 18.

The secondary traces 80 are coplanar with the first underpath 70 and the second underpath 72, and are disposed in a spaced, parallel and partially coextensive relationship with the first spiral conductive trace 46. That is, underneath select segments of the first spiral conductive trace 46, there are the secondary traces 80 having substantially the same width of 5 μm. This is understood to effectively increase the thickness of the first spiral conductive trace 46. The secondary traces 80 are electrically connected to the first spiral conductive trace 46 via stubs 84. In the illustrated embodiment, the stubs 84 are disposed only at the corners of the turns of the first spiral conductive trace 46. Each of the secondary traces 80 have an exemplary thickness of 0.5 μm, though depending on the particular requirements of the directional coupler 10, as with the other physical parameters, may be adjusted.

Figure 8:
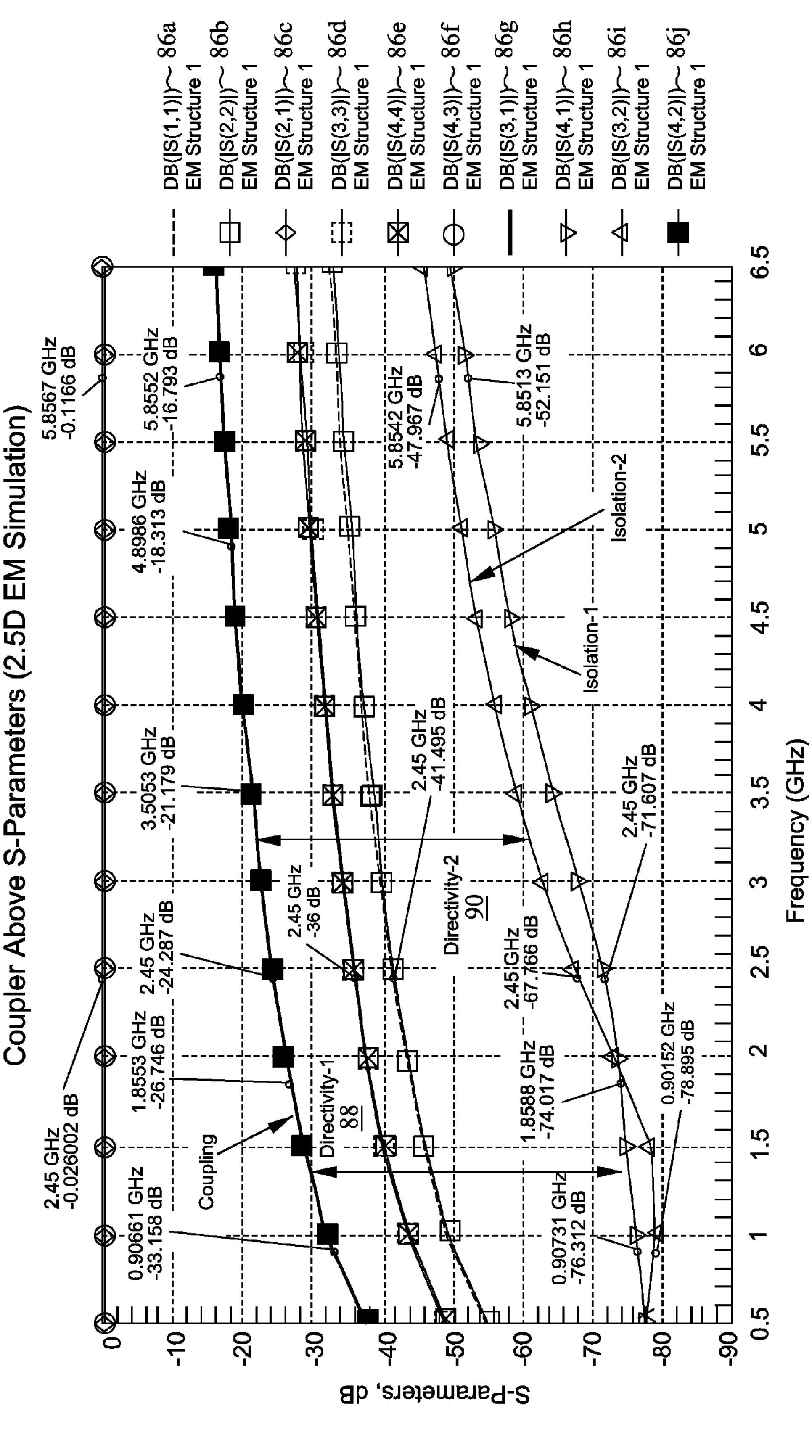
FIG. 8 is a graph of the S-parameters of the second embodiment of the directional coupler.

The effectively increased thickness of the first spiral conductive trace 46 is understood to increase the capacitive coupling between the first spiral conductive trace 46 and the second spiral conductive trace 60. Furthermore, as described in relation to the first embodiment 10*a*, the first underpath 70 and the second underpath 72 are both capacitively coupled to the first spiral conductive trace 46 and the second spiral conductive trace 60. This simultaneous inductive and capacitive coupling between the first spiral conductive trace 46 and the second spiral conductive trace 60 is understood to improve directivity. The performance of the second embodiment of the directional coupler 10*b* will be described in relation to the graph of FIG. 8. The graph similarly plots 86*a*-86*j* the various S-parameters of the directional coupler 10*b* in the same arrangement as in FIG. 3. A first directivity 88 and a second directivity 90 are similar in value to the first directivity 77 and the second directivity 78 exhibited in the first embodiment of the directional coupler 10*a*. With the increased effective thickness of the first spiral conductive trace 46, the insertion loss is lower due to the decreased loss associated with the conductive traces.

Figure 9:
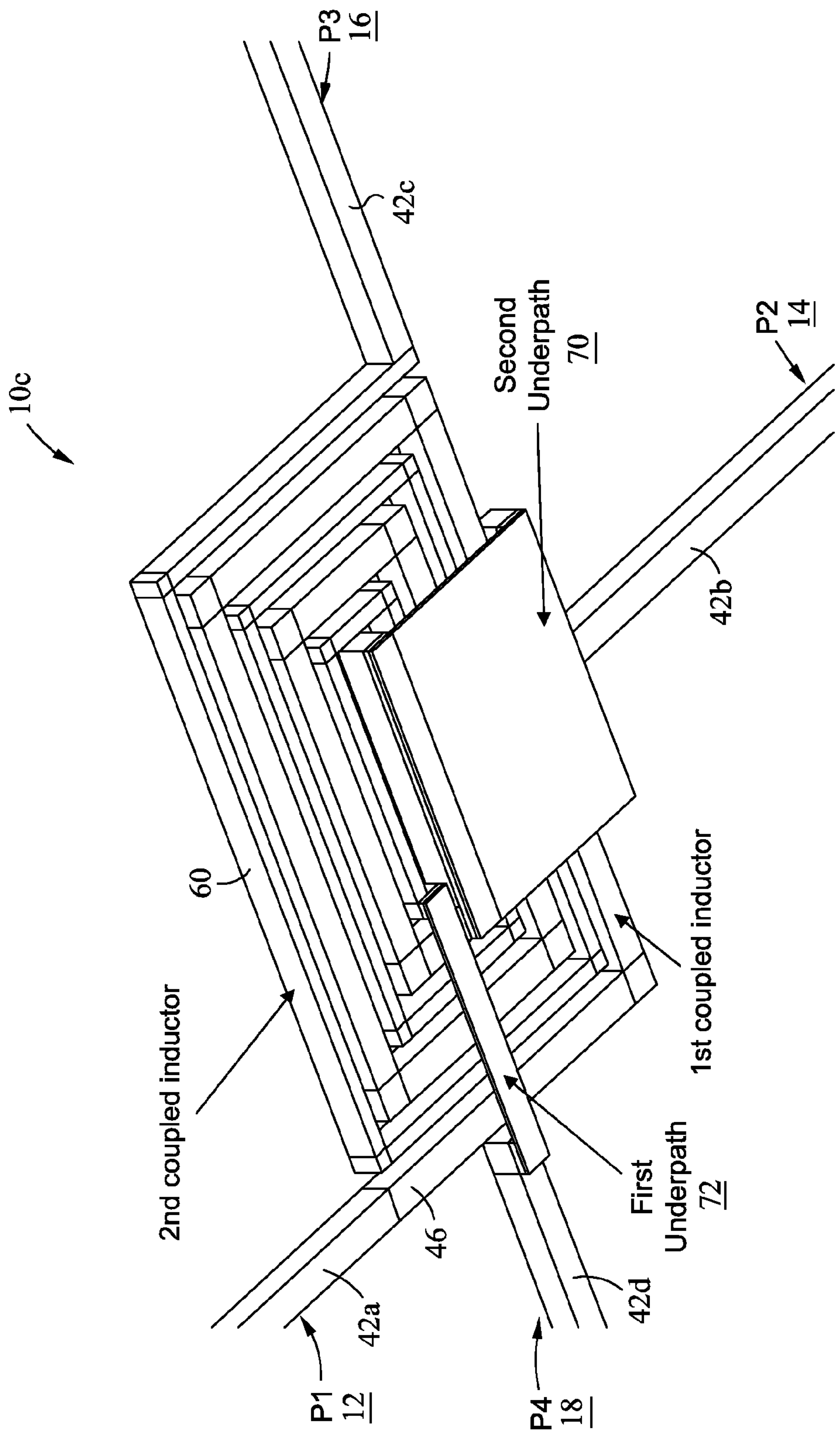
FIG. 9 is a perspective view of a third embodiment of the directional coupler.

An exemplary third embodiment of the directional coupler 10*c* shown in FIG. 9 does not include the conductive circuit elements such as the stubs 84 otherwise included in the second embodiment 10*b*, or the capacitive stubs 74 otherwise included in the first embodiment 10*a*. The third embodiment of the directional coupler 10*c* has the same trace width and thickness dimensions, the same configuration of the first underpath 70 and the second underpath 72, and the same overall dimensions of the other implementations. Even without the thickness added by the conductive circuit elements, the first spiral conductive trace 46 and the second spiral conductive trace 60 have sufficient capacitive coupling between the two, as further contributed to by the first underpath 70 and the second underpath 72, to such an extent that the directional coupler 10*c* exhibits acceptable directivity performance characteristics.

Figure 10:
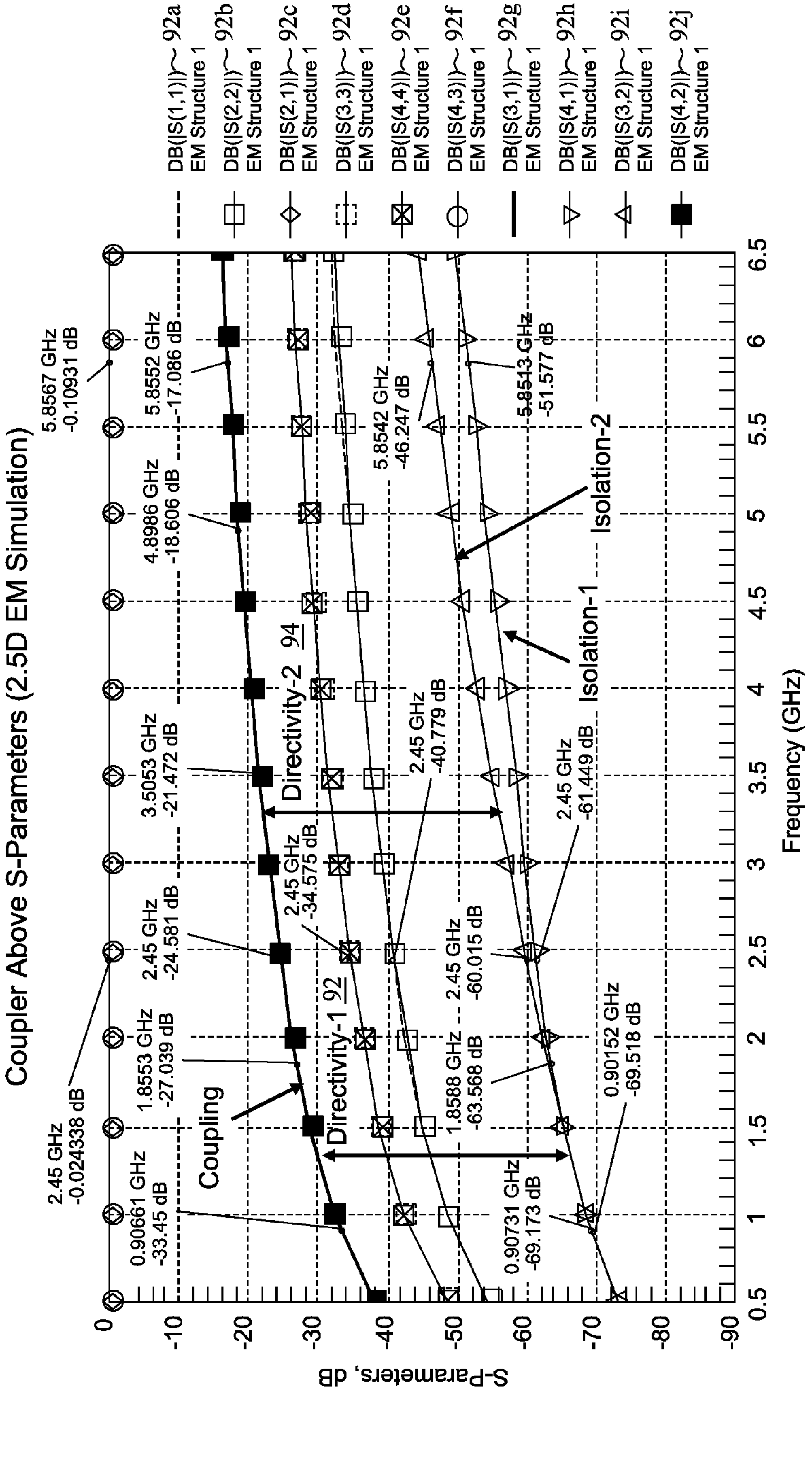
FIG. 10 is a graph of the S-parameters of the third embodiment of the directional coupler.

The graph of FIG. 10 shows the simulated S-parameters of the third embodiment of the directional coupler 10*c*. Specifically, plots 92*a*-92*j* show the same S-parameters discussed in relation to the graph of FIG. 8, and the difference between S31 (coupling factor, plot 92*g*) and S41 (isolation, plot 92*h*) represents a first directivity 92. The difference between S31 and S32 (isolation, plot 92*i*) represents a second directivity 94. In comparison with the first directivity 88 and the second directivity 90 both of the second embodiment of the directional coupler 10*b*, the first directivity 92 and the second directivity 94 both of the third embodiment of the directional coupler 10*c* are decreased, though still above 25 to 30 dB. As mentioned above, this level of directivity is suitable for many applications.

Figure 11:
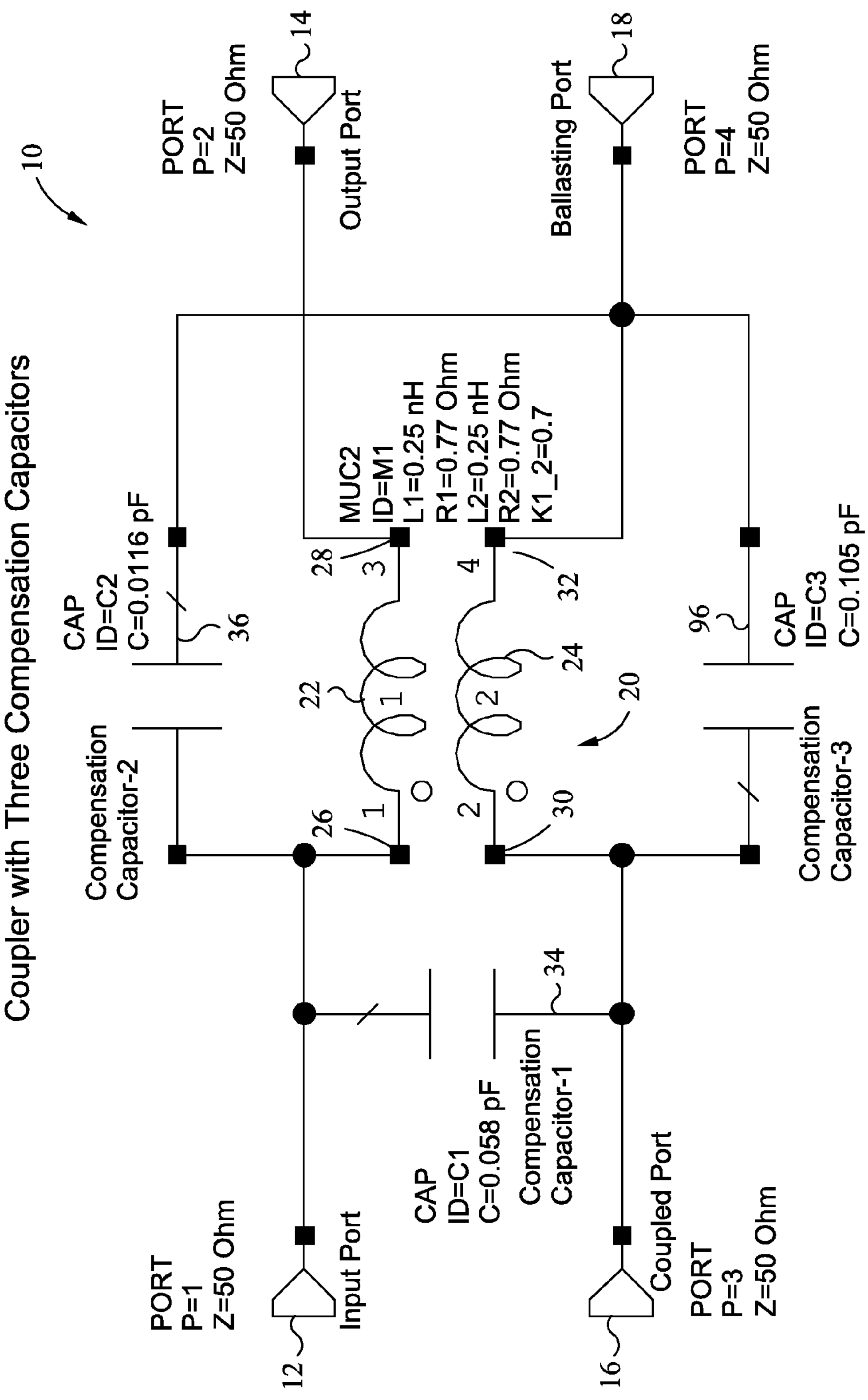
FIG. 11 is a schematic diagram illustrating another embodiment of the directional coupler in accordance with the present disclosure.

Referring now to the schematic diagram of FIG. 11, there is contemplated another variant of a directional coupler 11, which is in many respects similar to the directional coupler 10. This variant likewise includes an input port 12, an output port 14, a coupled port 16, and a ballasting port 18. Functionally, a portion of the signal that is applied to the input port 12 is passed through to the output port 14, and another portion of the same is passed to the coupled port 16. A minimal signal level is present on the ballasting port 18. For purposes of discussing and graphically illustrating the scattering parameters (S-Parameters), in similar fashion as the directional coupler 10, the input port 12 may be referred to as port P1, the output port 14 may be referred to as port P2, the coupled port 16 may be referred to as port P3, and the ballasting port 18 may be referred to as port P4. Each of the ports is understood to have a characteristic impedance of 50 Ohm for standard matching of components.

The directional coupler 11 is comprised of the first transmission element 22 and the second transmission element 24, which may also be referred to individually as inductors. The first transmission element 22 has the first connection 26 to the input port 12 and the second connection 28 to the output port 14. The second transmission element 24 has another first connection 30 to the coupled port 16 and another second connection 32 to the ballasting port 18. By way of example only and not of limitation, the first transmission element 22 or inductor, as well as the second transmission element 24 or inductor, have inductance values of 0.25 nH, and a resistance of 0.77 Ohm.

Again, like the directional coupler 10, the directional coupler 11 includes the first compensation capacitor 34 that is connected to the input port 12 and the coupled port 16, in addition to the second compensation capacitor 36 that is connected to the input port 12 and the ballasting port 18. The first compensation capacitor 34 may have a capacitance value of, for example, 0.058 pF, while the second compensation capacitor 36 may have a capacitance value of 0.011 pF. The directional coupler 11 further includes a third compensation capacitor 96 with an exemplary capacitance value of 0.105 pF. The third compensation capacitor 96 is connected across the second transmission element 24, that is, from the coupled port 16 to the ballasting port 18. As will be described in further detail below, the three compensation capacitors is understood to permit the tuning of the directional coupler 11 to have much higher directivity at specific frequencies.

Figure 12:
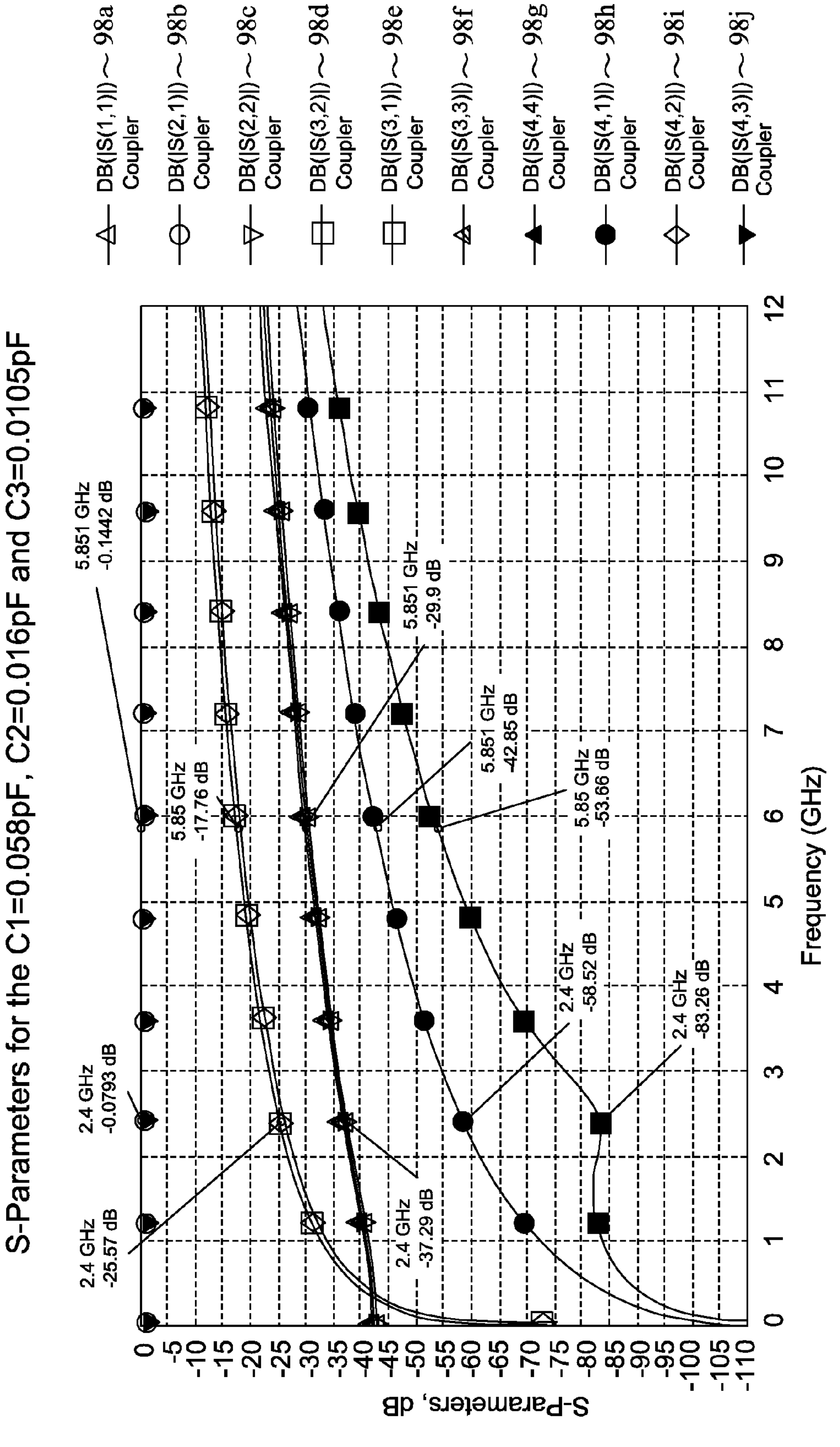
FIG. 12 is a graph of the S-parameters of the directional coupler shown in FIG. 11.
Figure 13:
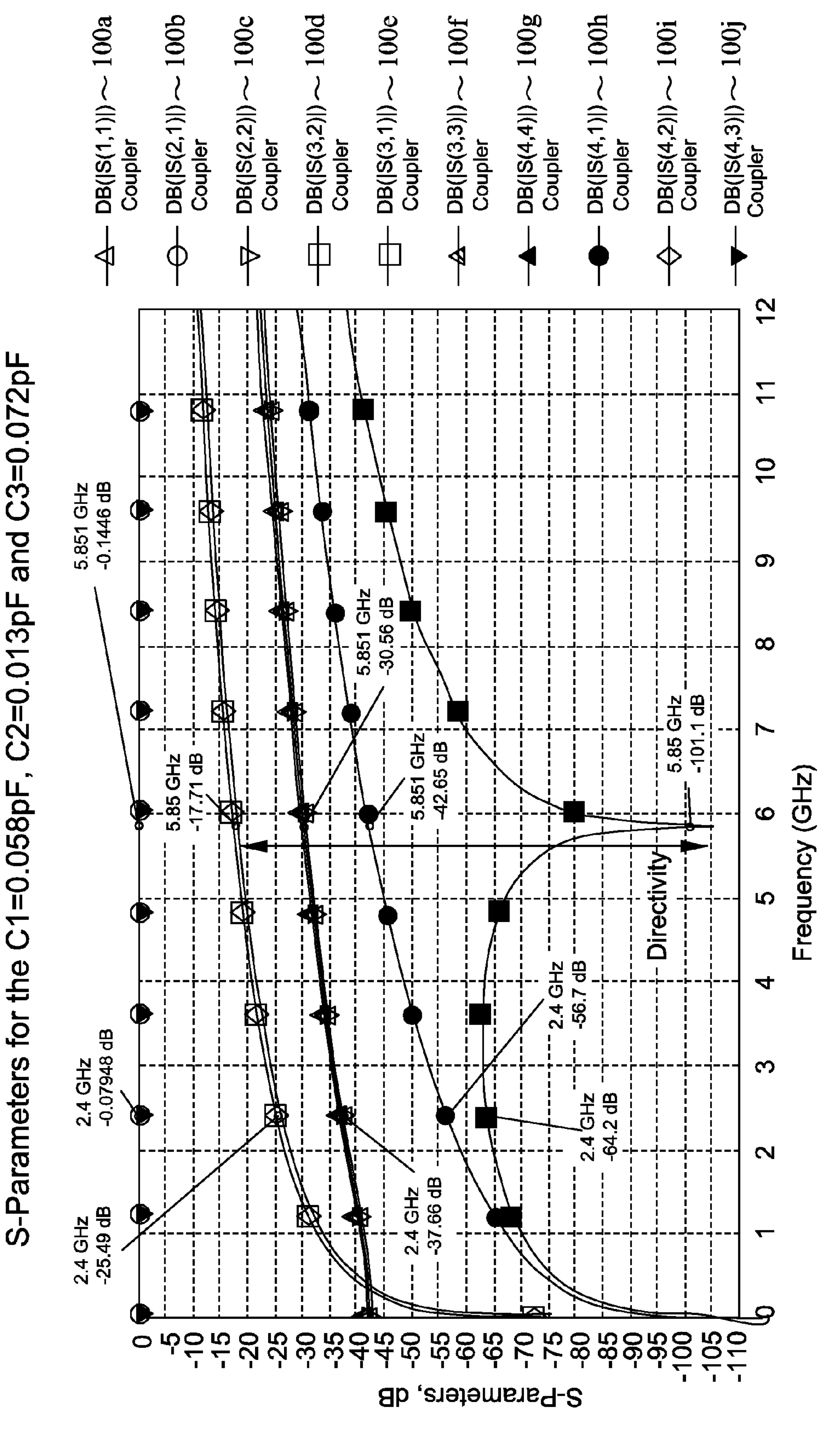
FIG. 13 is a graph of the S-parameters of the directional coupler with three compensation capacitors as generally depicted in FIG. 11, but with a different set of compensation capacitors.

The following graphs of FIGS. 12, and 13 illustrate the simulated S-parameters, and specifically the directivity of the directional coupler based upon various capacitance values of the first compensation capacitor 34, the second compensation capacitor 36, and the third compensation capacitor 96. The graph of FIG. 12 includes plots 98*a*-98*j* for the first compensation capacitor with a value of 0.058 pF, the second compensation capacitor with a value of 0.016 pF, and the third compensation capacitor with a value of 0.105 pF. The first directivity is defined by the difference between the coupling factor (S31) and the first isolation (S32) and the second directivity is defined by the difference between the coupling factor and the second isolation (S41). The graph of FIG. 13 includes plots 100*a*-100*j* for the first compensation capacitor with a value of 0.058 pF, the second compensation capacitor with a value of 0.0131 pF, and the third compensation capacitor with a value of 0.072 pF. The compensation capacitors in this case are optimized for the 5.85 GHz operating frequency, where the first isolation S32 is greatly increased therefor. As shown, the directivity is expected to be around 90 dB.

Figure 14:
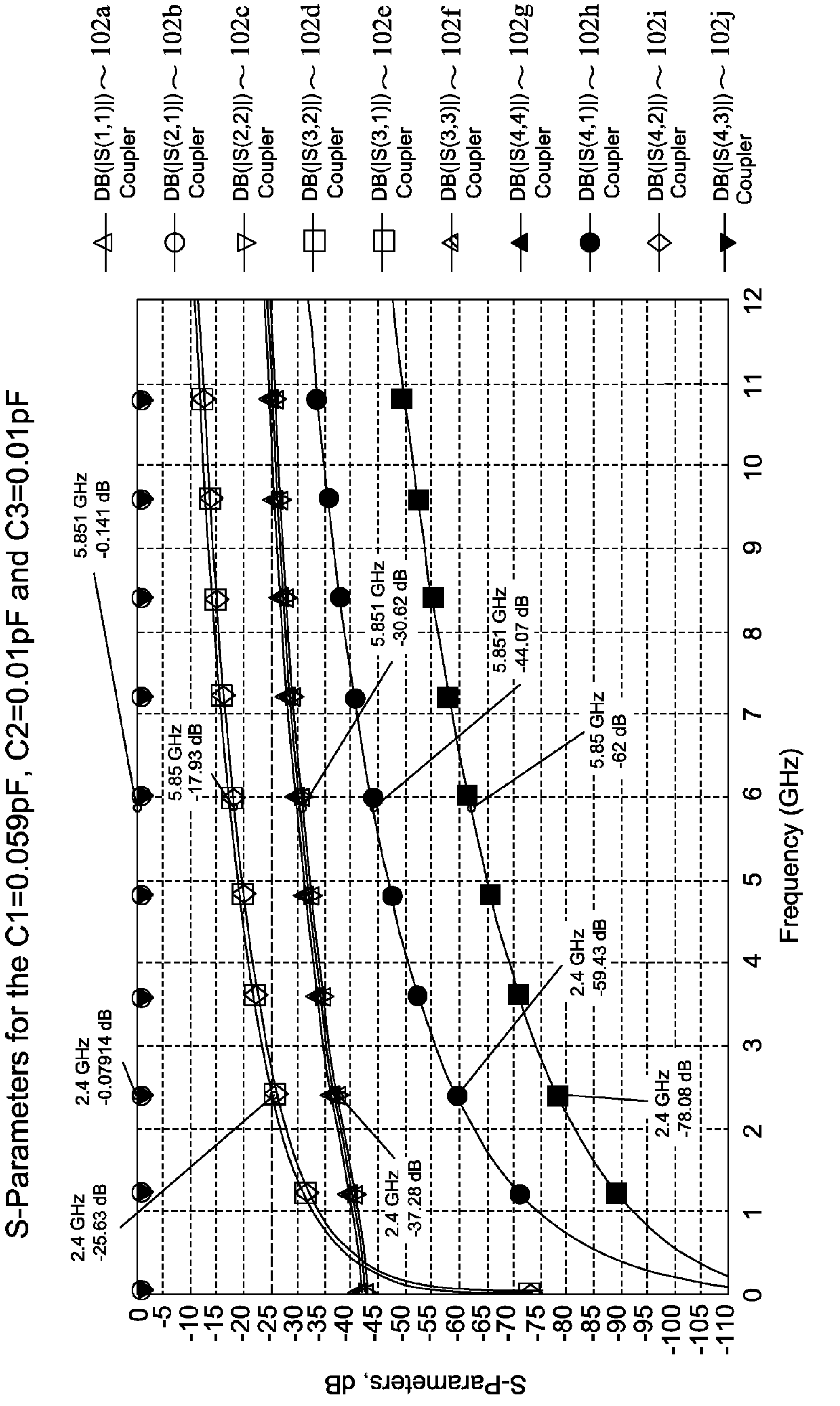
FIG. 14 is a graph of the S-parameters of the directional coupler with three compensation capacitors as generally depicted in FIG. 11, but having a set of nominal values for purposes of simulating and evaluating the sensitivity of the component values to coupler performance.
Figure 15:
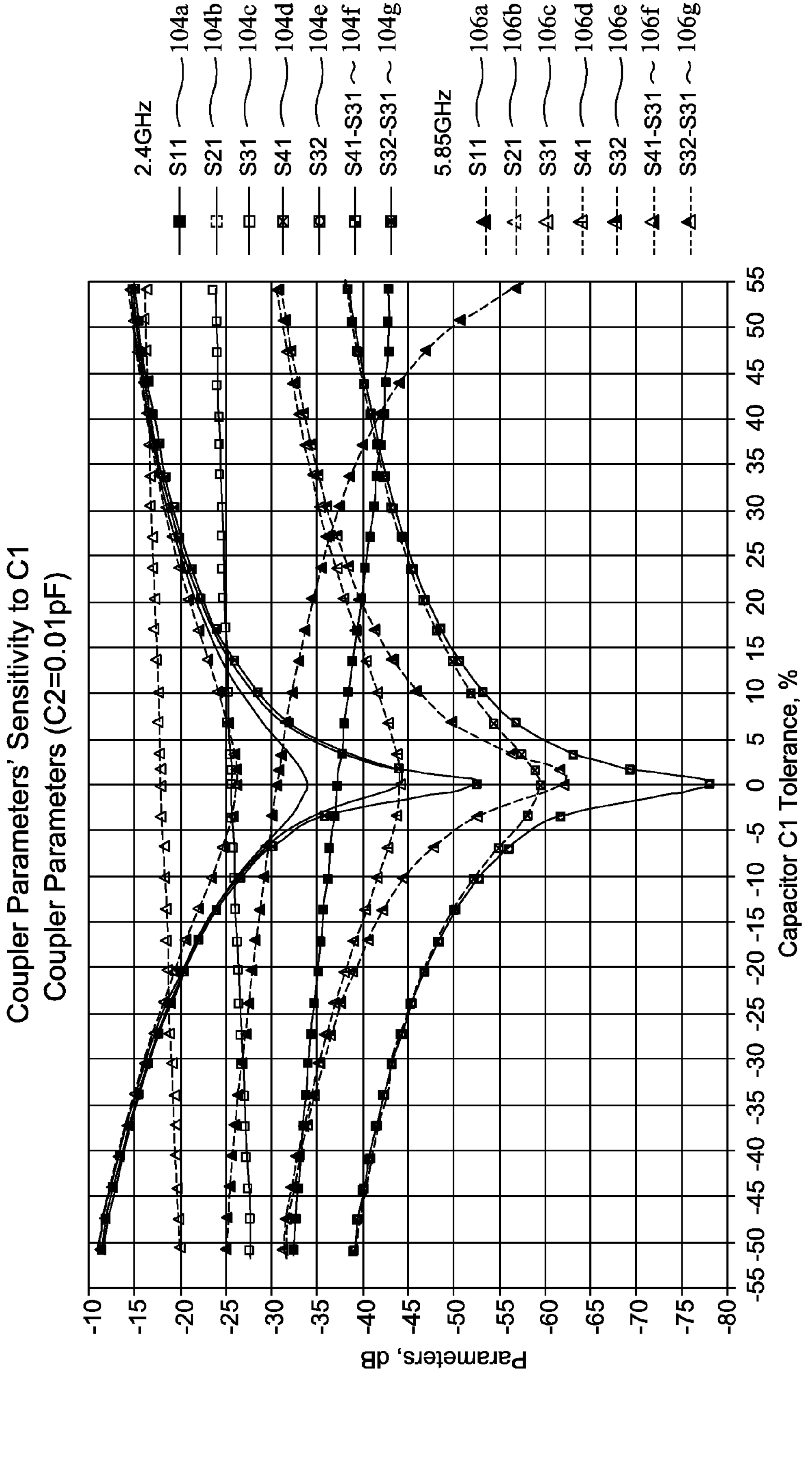
FIG. 15 is a graph of the S-parameters at two specific operating frequencies over a range of compensation capacitor variances.
Figure 16:
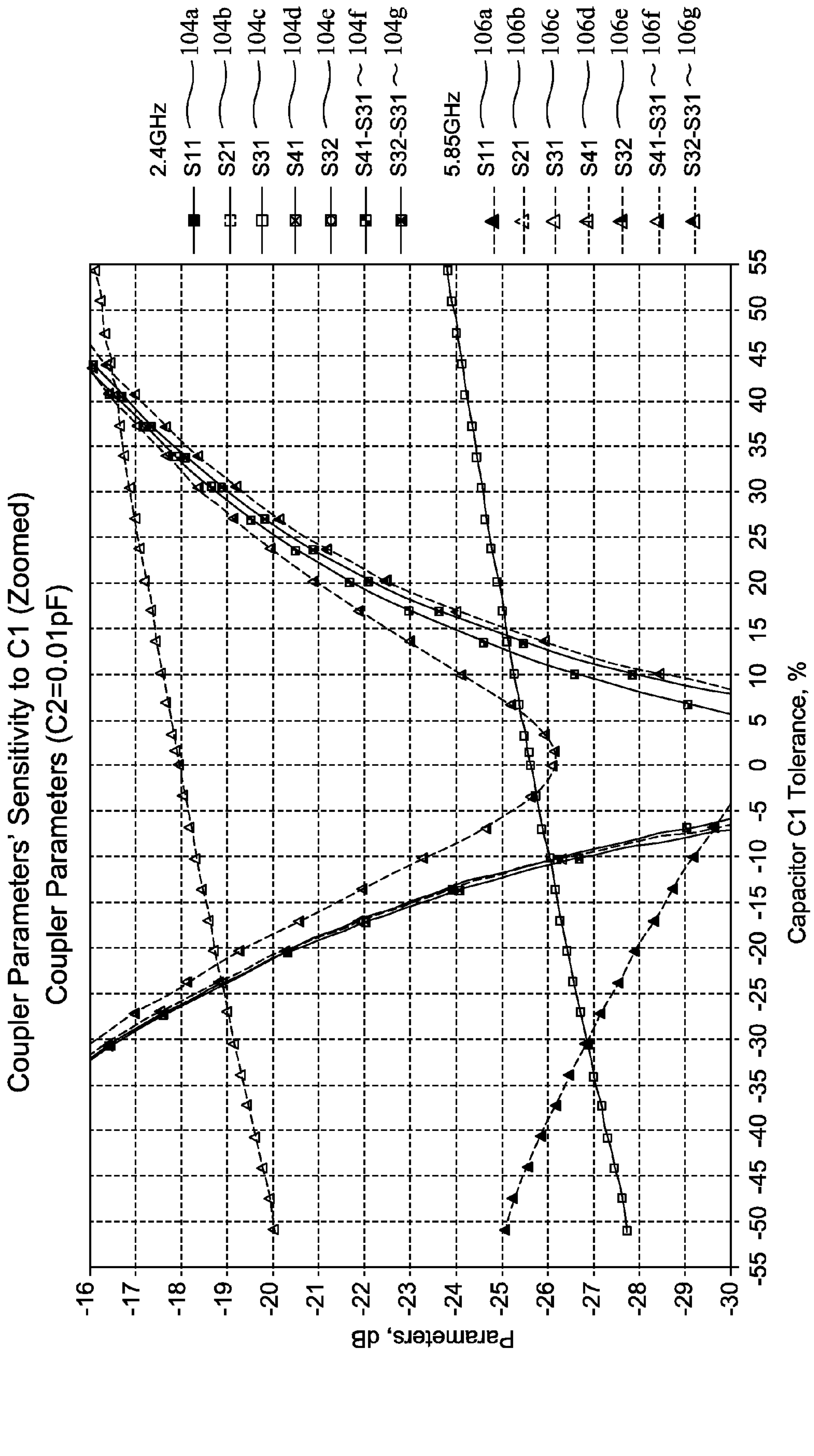
FIG. 16 is detailed, expanded graph of FIG. 15 showing the S-parameters at two specific operating frequencies over a range of compensation capacitor variances.

The sensitivity of the values of the first compensation capacitor 34 on the performance of the directional coupler 10 can be evaluated from a simulation sweeping the range of potential variances. The nominal value of the second compensation capacitor 36 is set to 0.01 pF, and the nominal value of the third compensation capacitor 96 is also set to 0.01 pF. Initially, the nominal value of the first compensation capacitor C1 is set to 0.059 pF. Based on these compensation capacitors, the S-parameters are shown in the graph of FIG. 14 as plots 102*a*-102*j*. Referring now to the graph of FIG. 15 with additional details thereof shown on FIG. 16, there is a first set of plots for the 2.4 GHz operating frequency, including a first plot 104*a* of S11, a second plot 104*b* of S21, a third plot 104*c* of the coupling factor S31, a fourth plot 104*d* of the first isolation factor S32, and a fifth plot 104*e* describing the second isolation factor S32. The difference between S41 and S31, the first directivity, is shown as sixth plot 104*f*, and the difference between S32 and S31, the second directivity, is shown as a seventh plot 104*g*. Similar plots are shown for the 5.8 GHz operating frequency, including a first plot 106*a* of S11, a second plot 106*b* of S21, a third plot 106*c* of the coupling factor S31, a fourth plot 106*d* of the first isolation factor S32, and a fifth plot 106*e* of the first isolation factor S32. The difference between S41 and S31, the first directivity for 5.8 GHz, is shown as a sixth plot 106*f*, and the difference between S32 and S31, the second directivity, is shown as a seventh plot 106*g*. In further detail, the directivity (S32-S31) is above 30 dB when the first compensation capacitor 34 is within +/−7%, with the coupling coefficient S31 variation being less than +/−0.35 dB. It will be recognized that a variation of 7% is typical for semiconductor processes.

Figure 17:
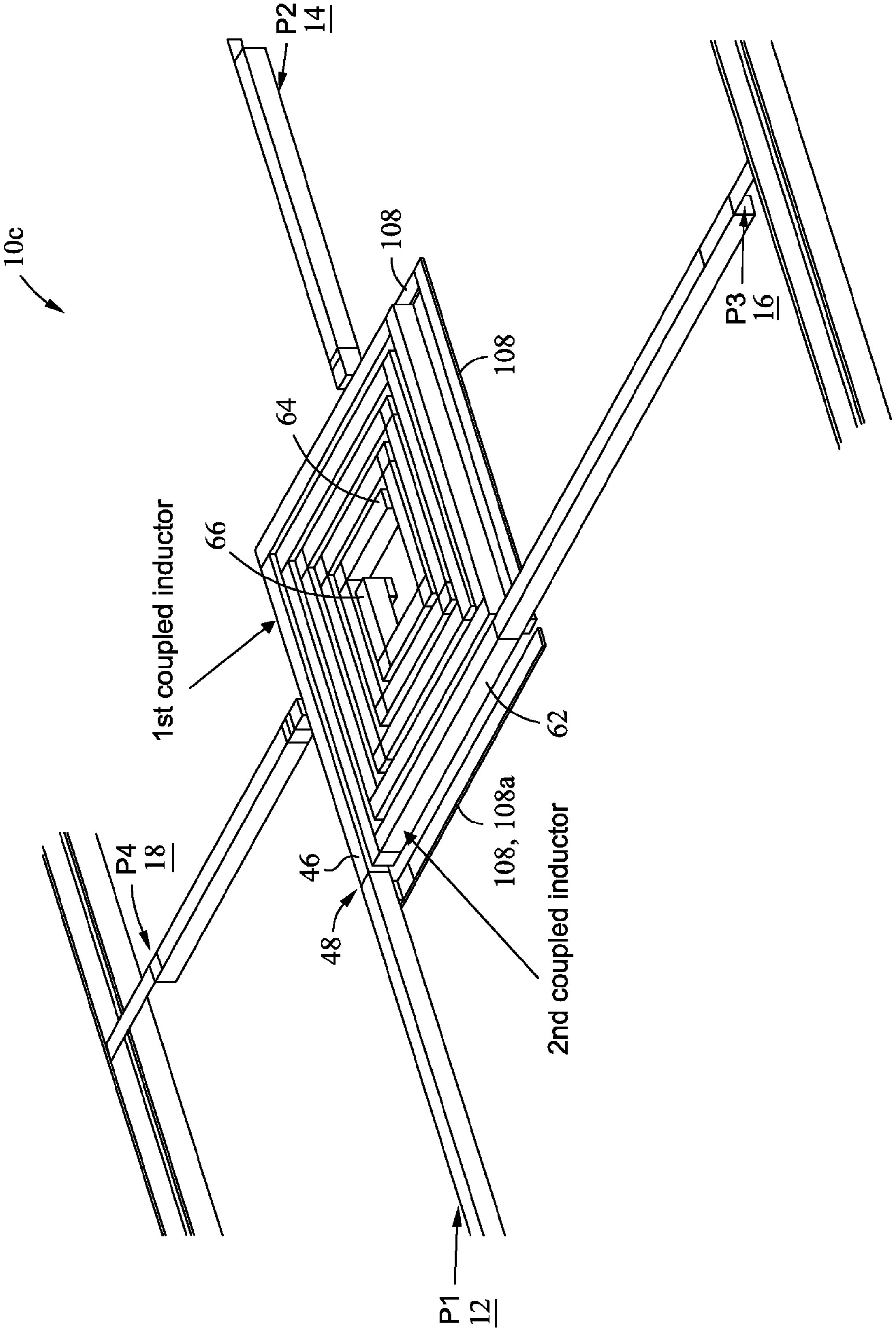
FIG. 17 is a perspective view of a fourth embodiment of the directional coupler in accordance with the present disclosure.

Various embodiments of the present disclosure contemplate one or more conductive circuit elements disposed on the dielectric layer 44 for increasing the capacitive coupling of the first spiral conductive trace 46 to the second spiral conductive trace 60. A fourth embodiment of the directional coupler 10*d* is shown in FIG. 17, and includes yet another conductive circuit element different from the capacitive stubs discussed above. The conductive circuit element in this embodiment is contemplated to be a set of conductive trace wings 108.

The general structure of the directional coupler 10*d* is similar to those of the other embodiments, and includes the input port 12 (P1), the output port 14 (P2), the coupled port 16 (P3), and the ballasting port 18 (P4). The outer terminus 48 of the first spiral conductive trace 46 is connected to the input port 12, and its inner terminus 54 is connected to the output port 14 via the first underpath 70. Furthermore, the outer terminus 62 of the second spiral conductive trace 60 is connected to the coupled port 16, and its inner terminus 66 is connected to the ballasting port 18 via the second underpath 72. The first spiral conductive trace 46 and the second spiral conductive trace 60 are in a spaced, interlocking and coplanar relationship to each other.

Figure 18:
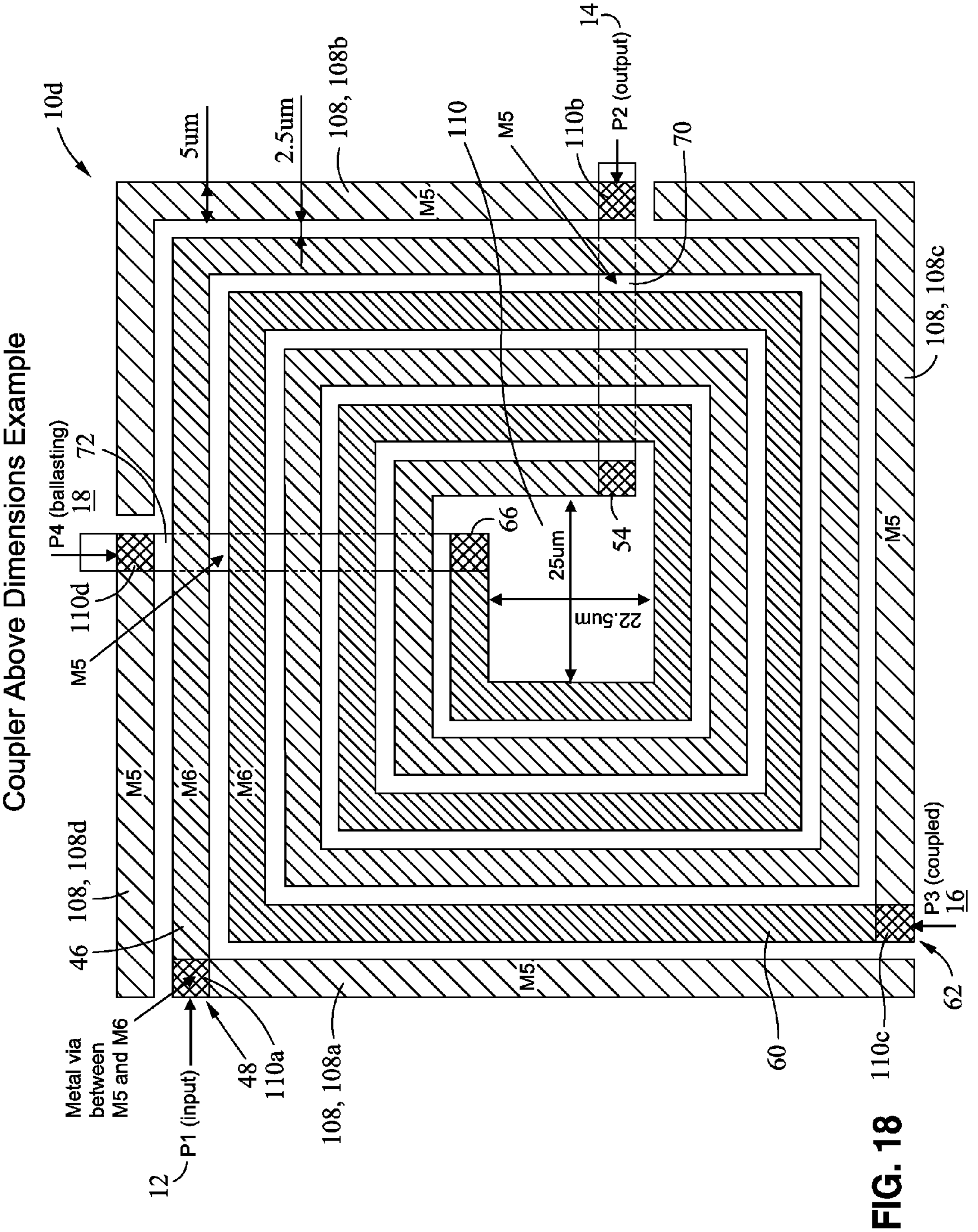
FIG. 18 is a top plan view of the directional coupler shown in FIG. 17.

With reference to the top plan view of the directional coupler 10*d* shown in FIG. 18, the dimensions however, may be different in an exemplary implementation. For instance, the overall outer dimensions are 107.5 μm×110 μm. Moreover, the width of the first spiral conductive trace 46 and the second spiral conductive trace 60 are the same at 5 μm, and are separated 2.5 μm. An interior gap 110 has dimensions of 25 μm×22.5 μm. The thickness of the first spiral conductive trace 46 and the second spiral conductive trace 60 are the same, and are both understood to be on the same metal layer, designated as M6.

There are four conductive trace wings 108 of the directional coupler 10*d*. Specifically, a first conductive trace wing 108*a* that is attached via a first stub 110*a* to the outer terminus of the first spiral conductive trace 46, and extends in a perpendicular relationship to a segment thereof. There is also a second conductive trace wing 108*b* that is attached via a second stub 110*b* to the output port 14. To maximize length, the second conductive trace wing 108*b* defines a bend and extends until reaching the second underpath 72. Likewise, a third conductive trace wing 108*c* is attached via a third stub 110*c* to the coupled port 16, and extends in a perpendicular relationship to a segment thereof. There is also a bend that extends the third conductive trace wing 108*c* to the output port 14. Attached via a fourth stub 110*d* to the second underpath 72 and extending in a perpendicular relationship thereto is a fourth conductive trace wing 108*d*. The conductive trace wings 108 are understood to be the same thickness as and coplanar with the first underpath 70 and the second underpath 72. In this regard, these traces are on the same metal layer, designated as M5. The thickness of the metal layer M5 is less than the thickness of the metal layer M6. These conductive trace wings 108 are contemplated to correspond to the various compensation capacitors discussed above in relation to the schematic diagram of FIG. 11.

Figure 19:
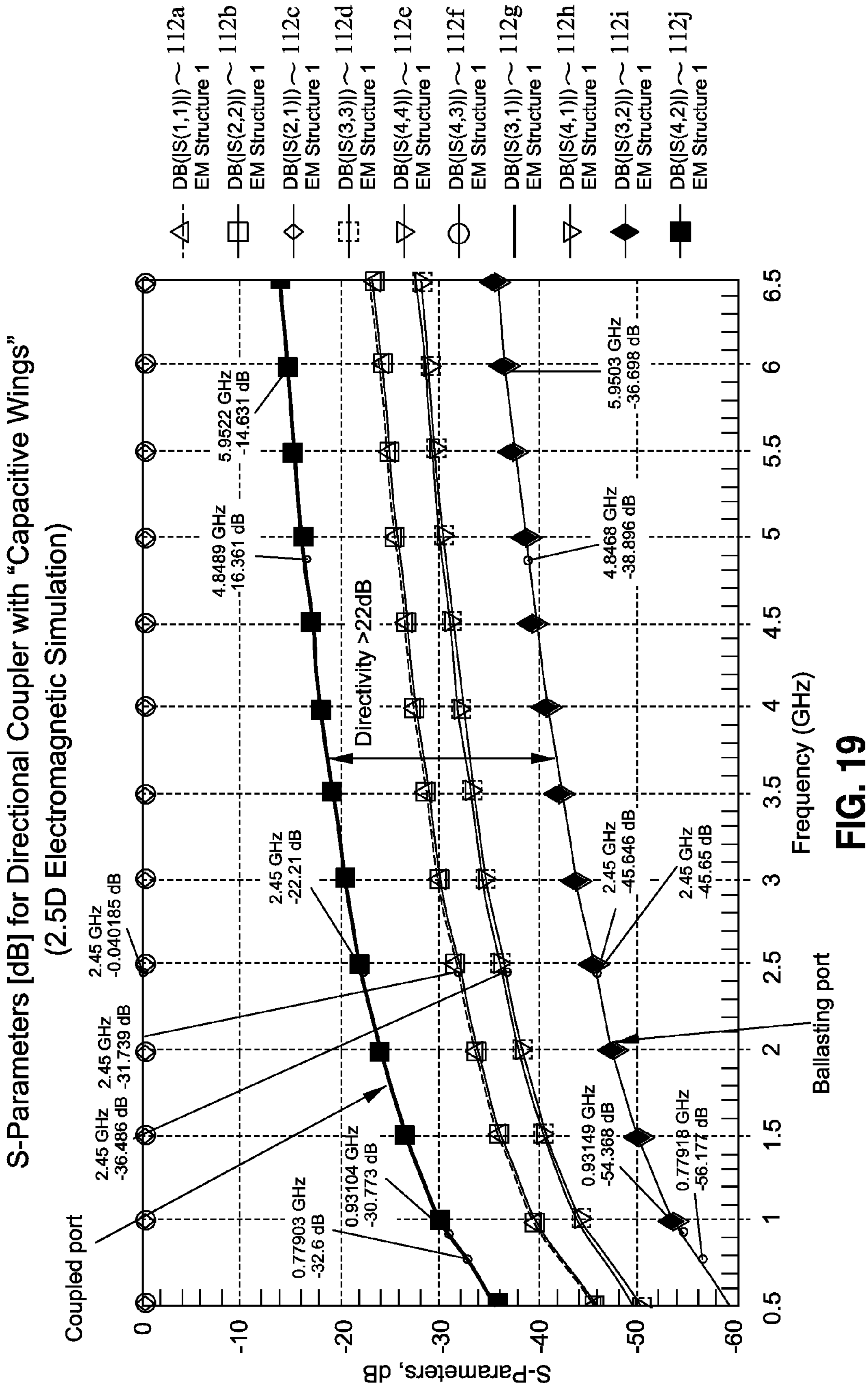
FIG. 19 is a graph of the S-parameters of the fourth embodiment of the directional coupler.

The graph of FIG. 19 shows the simulated S-parameters of the directional coupler 10*d*. Each of the aforementioned S-parameters discussed in relation to the graph of FIG. 3 are correspondingly shown as plots 112*a*-112*j*. Thus, to there will be no repetition of the specific name of the S-parameters and the performance characteristics represented thereby. It is illustrated that the first and second directivity are anticipated to be greater than 22 dB in the 3.5 GHz range.

Figure 20:
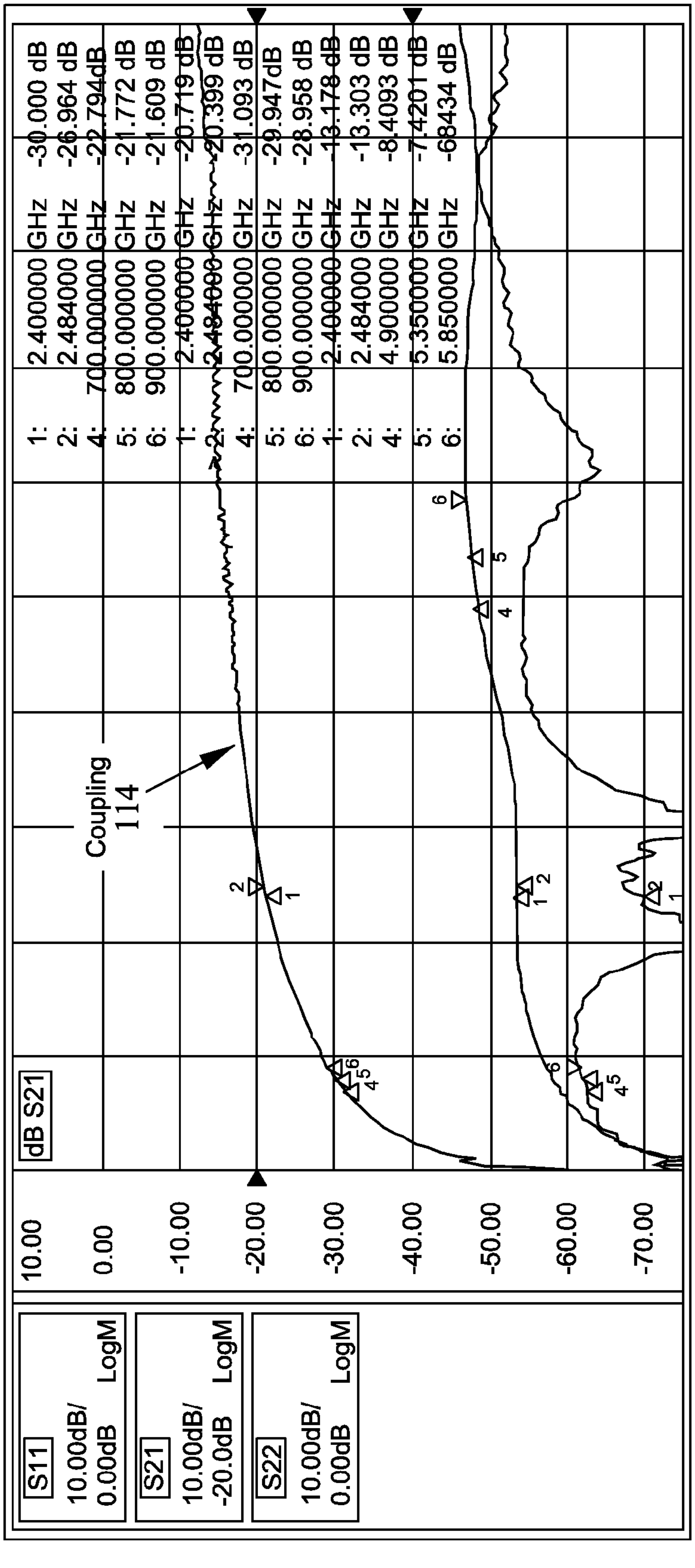
FIG. 20 is a graph of the measured S-parameters, specifically the coupling factor, of the fourth embodiment of the directional coupler.
Figure 21:
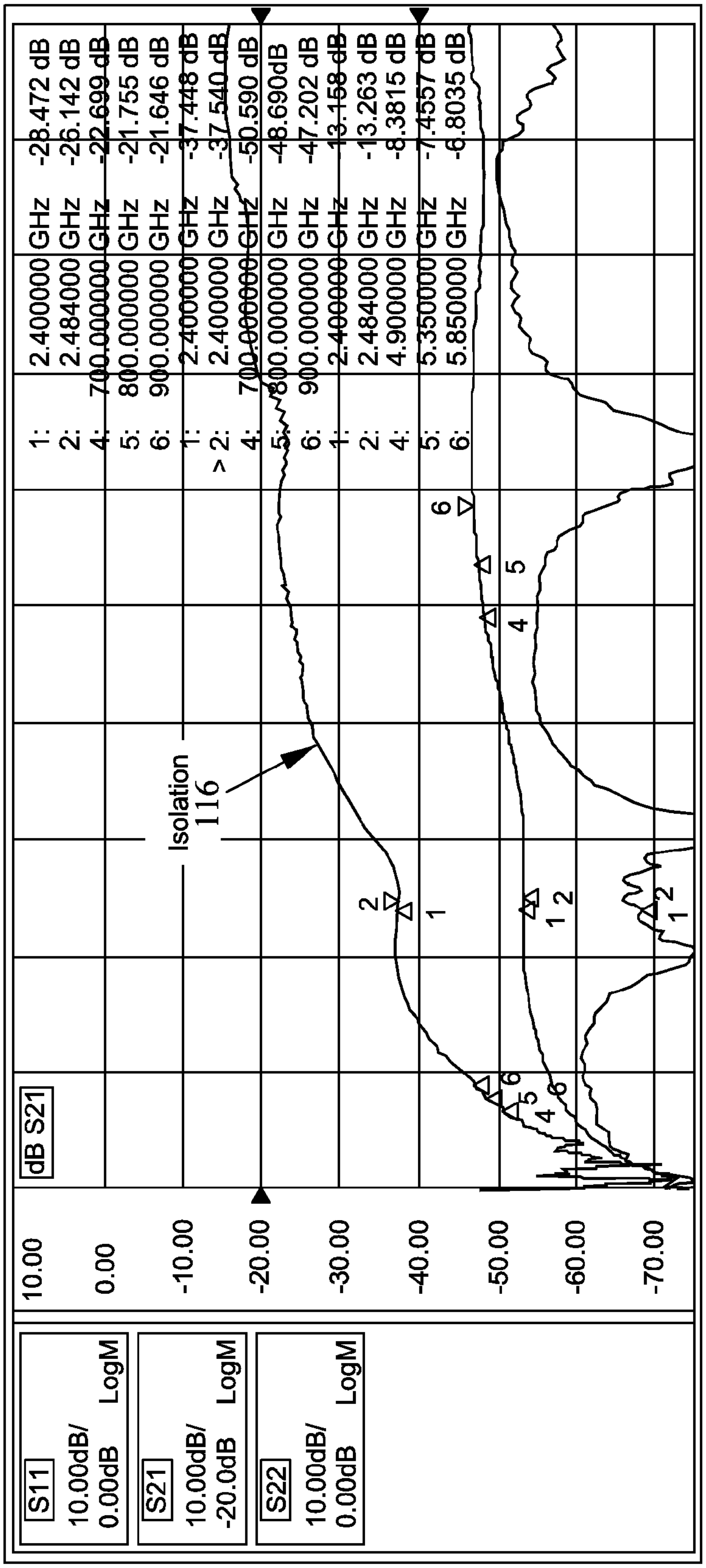
FIG. 21 is a graph of the measured S-parameters, specifically the isolation factor, of the fourth embodiment of the directional coupler.

In addition to the simulation, the actual performance of the directional coupler 10*d* is shown in the graphs of FIG. 20 and FIG. 21. The directional coupler 10*d* is fabricated in accordance with a mixed-signal RF Complementary Metal Oxide Semiconductor (CMOS) process, and has the dimensions as set forth in detail above, and packaged in a conventional Quad Flat No-Lead (QFN) type package. The tested operating frequencies are the 700-900 MHz range and the 2.4-2.5 GHz range. A plot 114 of FIG. 20 shows the coupling factor of the directional coupler 10*d*, while a plot 116 of FIG. 21 shows its isolation, with the difference corresponding to the directivity. At both frequency ranges of interest, the directivity is approximately 18 dB.

It is expressly contemplated that various optimizations of the directional coupler are possible with respect to the number of stubs utilized and the overall footprint area in order to maximize coupling and directivity, while also minimizing series loss. The graphs of FIGS. 22-26 plot the relationships as simulated.

Figure 22:
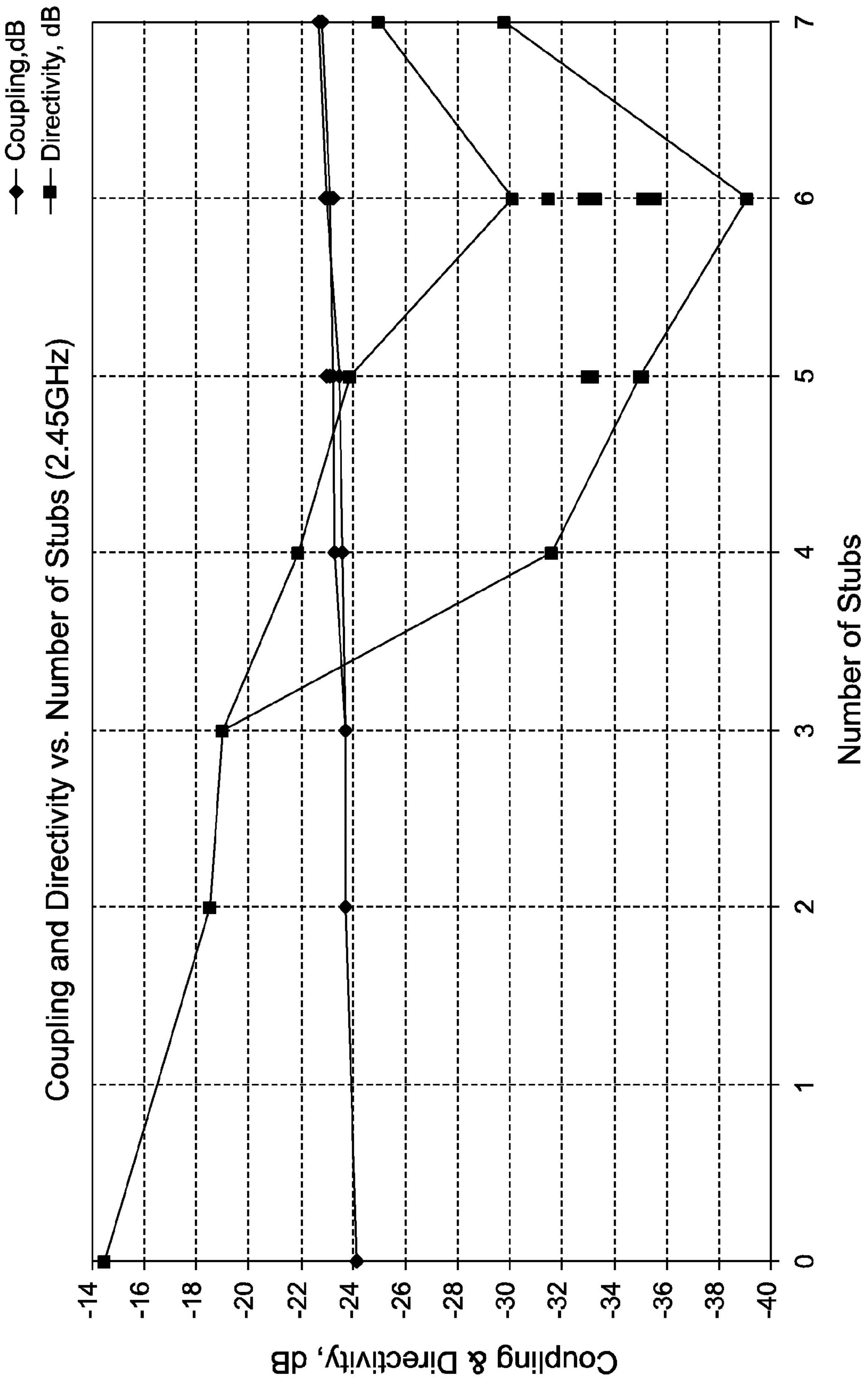
FIG. 22 is a graph plotting the coupling and directivity in relation to the number of stubs utilized in the directional coupler.
Figure 23:
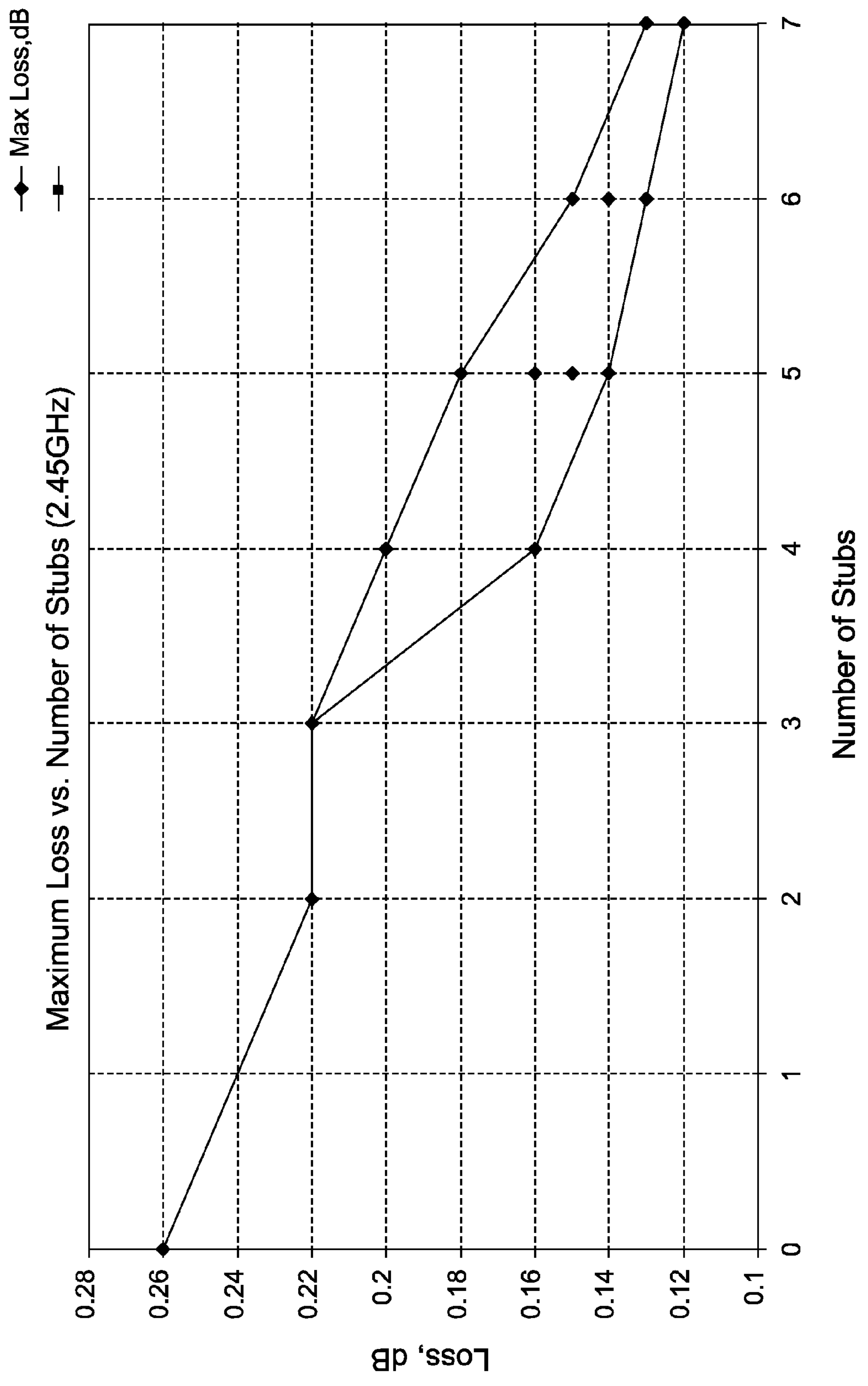
FIG. 23 is a graph plotting the series loss in relation to the number of stubs.

In further detail, the graph of FIG. 22 shows that there is an optimal number of stubs needed for the highest directivity at a particular operating frequency. The number of stubs utilized should be limited because of the additional series loss associated with each one. The graph of FIG. 23 illustrates the simulation results of coupler insertion loss over the number of stubs. It is understood that the series insertion loss of the directional coupler 10 decreases as the number of stubs increase, as the capacitance between the first inductor and the second inductor decreases equivalent series inductance in the first transmission element. In addition to the number of stubs, the physical length and width of the stubs also affects directivity. Thus, the optimal number of stubs could be different for other geometries.

Figure 24:
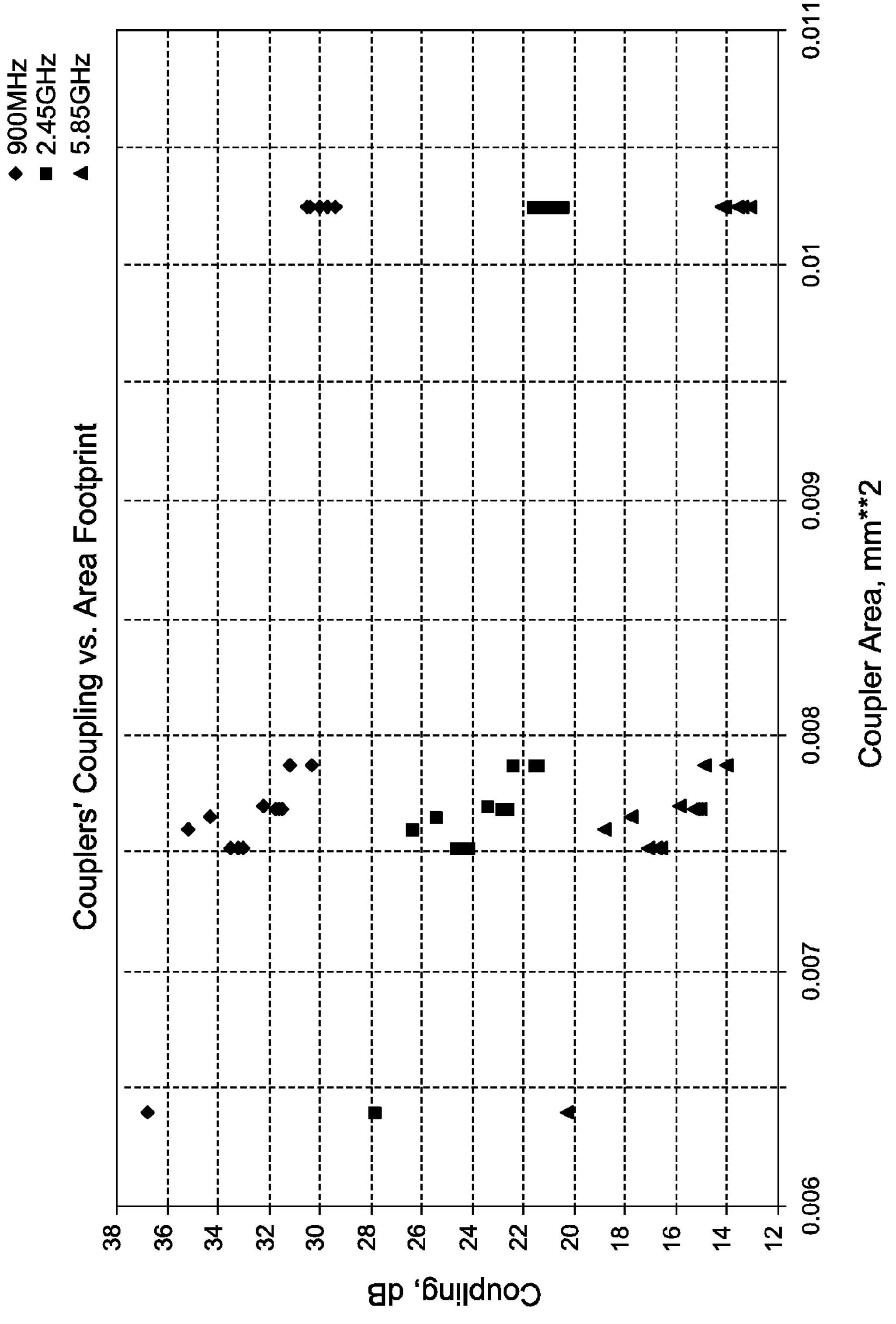
FIG. 24 is a graph plotting the coupling factor in relation to the overall footprint area of the directional coupler.
Figure 25:
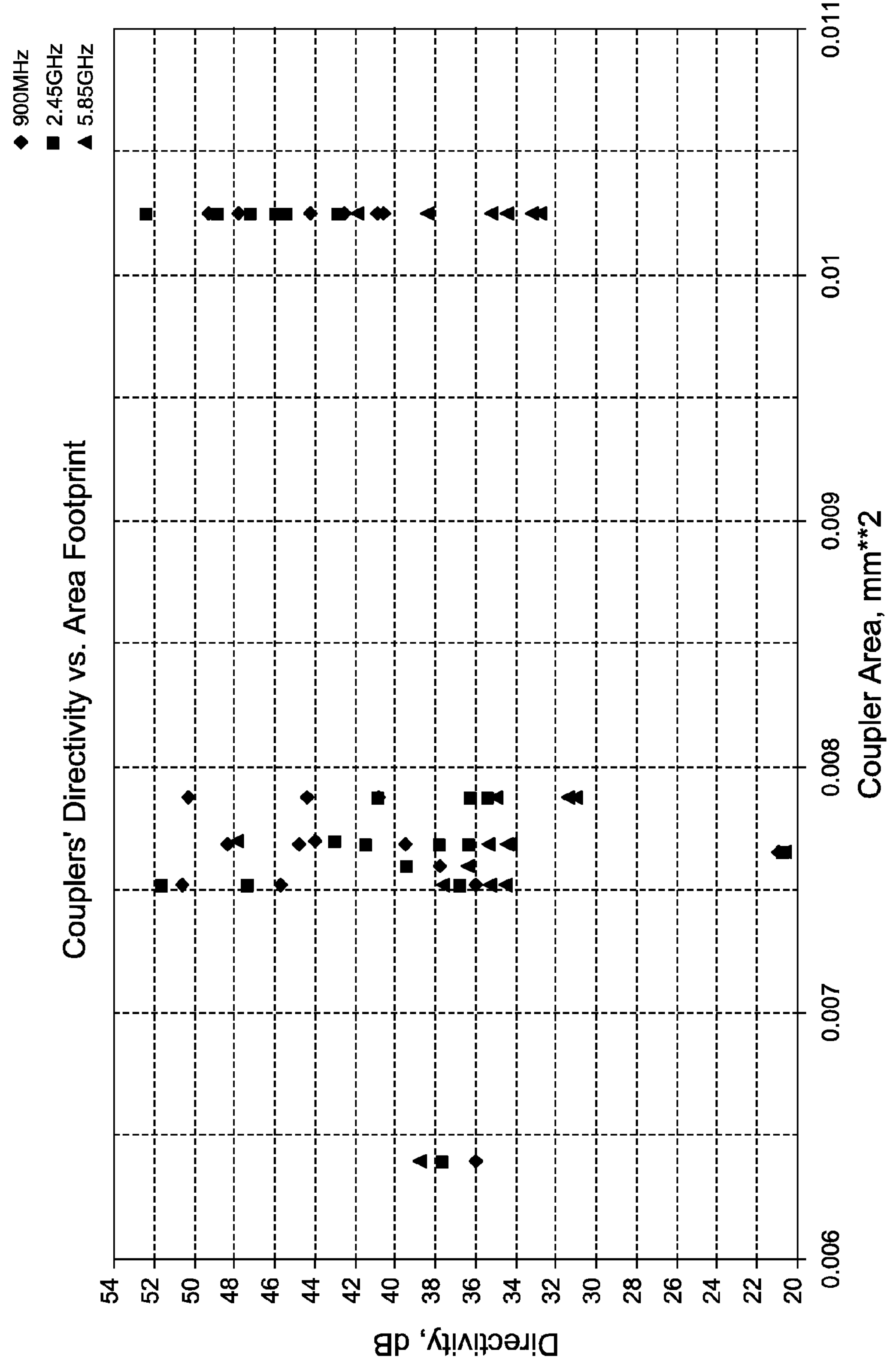
FIG. 25 is a graph plotting the directivity in relation to the overall footprint area of the directional coupler.
Figure 26:
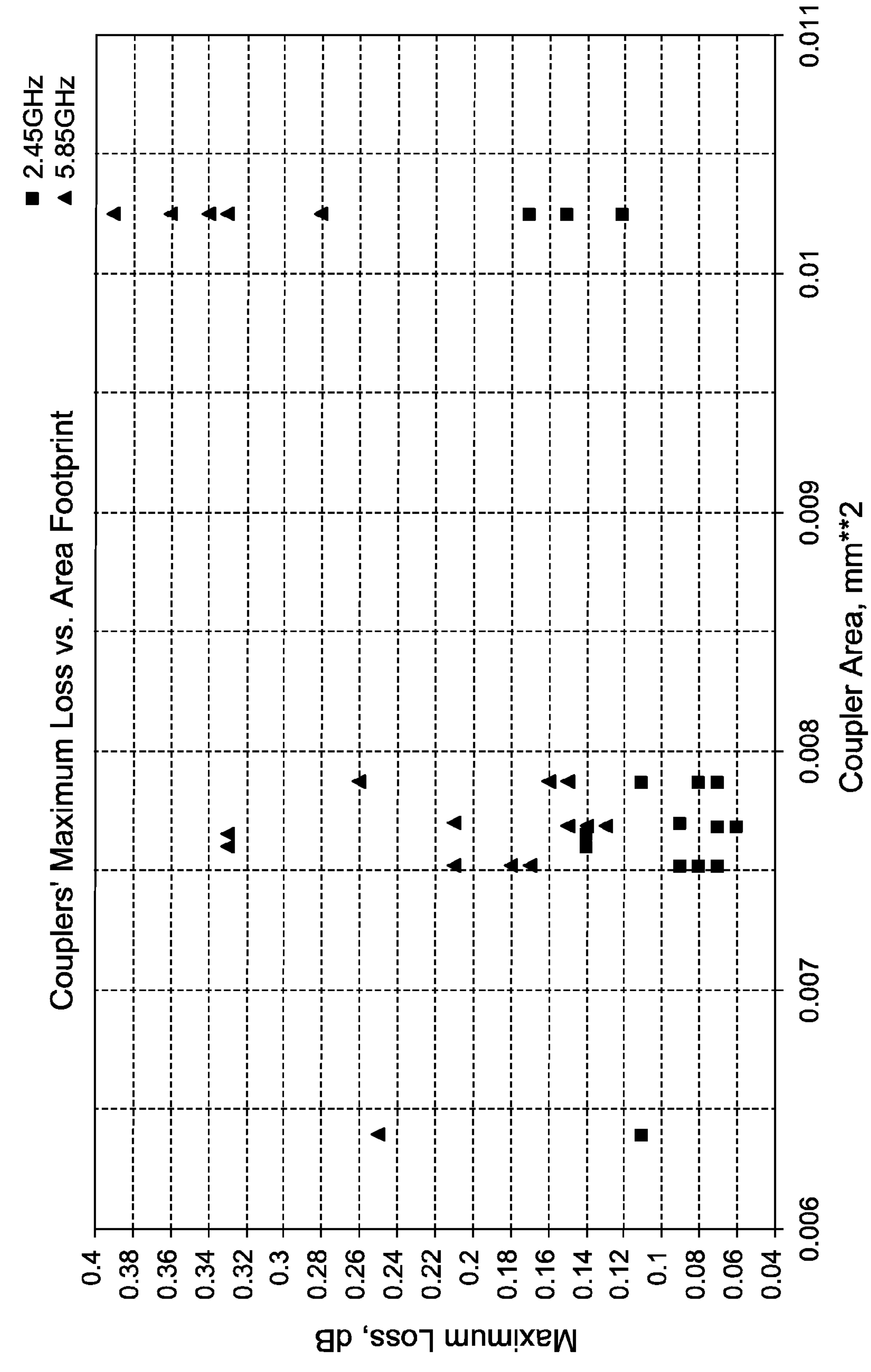
FIG. 26 is a graph plotting the series loss in relation to the overall footprint area of the directional coupler.

The overall footprint area of the directional coupler 10 affects the coupling factor, directivity, and series loss. The graph of FIG. 24 plots at various operating frequencies, including 900 MHz, 2.45 GHz, and 5.85 GHz, the coupling factors of different overall footprint areas. Generally, as the footprint increases, the coupling coefficient decreases for the same frequency. Furthermore, for the same footprint at the same frequency, the coupling coefficient may be varied (typically around the 1 dB to 2 dB range) depending on the geometry of the coupler and the number of stubs utilized, as discussed above. The variations in the coupling factors also translate to variations in the directivity, and are illustrated in the graph of FIG. 25. It is understood that directivity can vary within wide limits, depending on the operating frequency and the footprint area, as well as the number of stubs utilized. Furthermore, the graph of FIG. 26 illustrates that the insertion loss increases with coupler footprint, partially attributable to the conductive trace losses and dielectric losses resulting therefrom.

The various embodiments of the directional coupler 10 are based on couple inductors with the use of two or three compensation capacitors, and can be miniaturized. The compensation capacitors are implemented as the distributed coupling of conductive traces that are incorporated into the directional coupler 10. The above-described implementations are possible with low-cost semiconductor technologies, as proper performance does not depend on extremely precise component values. Furthermore, the particular configurations contemplated allow for high power levels due to higher breakdown voltages of the various components. As shown above, the high level of directivity can also be achieved based upon the tuning of the compensation capacitors at specific operating frequencies. Insertion loss is also minimized in the contemplated configurations of the directional coupler in part because of the small values of the coupled inductors and the reduced loss from the compensation capacitors.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention with more particularity than is necessary for the fundamental understanding of the present invention, the description taken with the drawings making apparent to those skilled in the art how the several forms of the present invention may be embodied in practice.

What is claimed is:

1. A directional coupler, comprising:

an input port;

an output port;

a coupled port;

a ballasting port;

a first transmission element having a first connection to the input port and a second connection to the output port;

a second transmission element having a first connection to the coupled port and a second connection to the ballasting port;

a first compensation capacitor connected to the input port and the coupled port;

a second compensation capacitor connected to the input port and the ballasting port; and a third compensation capacitor connected to the coupled port and the ballasting port;

wherein the first transmission element and the second transmission element are inductors, the first transmission element being inductively coupled to the second transmission element by a predefined coupling factor, the coupled port being isolated from the input port by a predefined first isolation factor, and the ballasting port being isolated from the input port by a predefined second isolation factor.

2. A directional coupler, comprising:

an input port;

an output port;

a coupled port;

a ballasting port;

a first transmission element having a first connection to the input port and a second connection to the output port;

a second transmission element having a first connection to the coupled port and a second connection to the ballasting port;

a first compensation capacitor connected to the input port and the coupled port; and a second compensation capacitor connected to the input port and the ballasting port;

wherein the first transmission element and the second transmission element are inductors, the first transmission element being inductively coupled to the second transmission element by a predefined coupling factor, the coupled port being isolated from the input port by a predefined first isolation factor, and the ballasting port being isolated from the input port by a predefined second isolation factor;

wherein a first directivity defined by the predefined coupling factor and the first isolation factor is different from a second directivity defined by the predefined coupling factor and the second isolation factor.

3. The directional coupler of claim 2, wherein the predefined first isolation factor is dependent at least in part on a capacitance value of the second compensation capacitor.

4. The directional coupler of claim 2, wherein the predefined second isolation factor is dependent at least in part on a capacitance value of the first compensation capacitor.

5. A directional coupler, comprising:

an input port;

an output port;

a coupled port;

a ballasting port;

a first transmission element having a first connection to the input port and a second connection to the output port;

a second transmission element having a first connection to the coupled port and a second connection to the ballasting port;

a first compensation capacitor connected to the input port and the coupled port;

a second compensation capacitor connected to the input port and the ballasting port; and a dielectric layer;

wherein the first transmission element and the second transmission element are inductors, the first transmission element being inductively coupled to the second transmission element by a predefined coupling factor, the coupled port being isolated from the input port by a predefined first isolation factor, and the ballasting port being isolated from the input port by a predefined second isolation factor;

wherein the first transmission element is a spiral conductive trace disposed on the dielectric layer and being defined by an outer terminus, a plurality of successively inward turns, and an inner terminus, and the second transmission element is second spiral conductive trace disposed on the dielectric layer and in a spaced coplanar relationship with the first conductive trace and inductively coupled thereto, the second spiral conductive trace being defined by an outer terminus, a plurality of successively inward turns, and an inner terminus.

6. The directional coupler of claim 5, wherein the first compensation capacitor is a capacitive stub connected to the coupled port and extending in a spaced parallel relationship to at least a part of the first spiral conductive trace.

7. The directional coupler of claim 5, further comprising:

a first underpath formed on the dielectric layer connecting the inner terminus of the second spiral conductive trace to the ballasting port; and a second underpath formed on the dielectric layer connecting the inner terminus of the first spiral conductive trace to the output port.

8. The directional coupler of claim 7, wherein the second compensation capacitor corresponds at least in part to capacitive coupling between the first transmission element and the second transmission element, capacitive coupling between the first underpath and the first and second transmission elements, and capacitive coupling between the second underpath and the first and second transmission elements.

9. The directional coupler of claim 8, further comprising:

secondary traces coplanar with the first underpath and the second underpath and disposed in a spaced, parallel and partially coextensive relationship with the first spiral conductive trace; and a plurality of stubs interposed between and electrically connecting the secondary traces and the first spiral conductive trace;

wherein the secondary traces together with the first spiral conductive trace increase capacitive coupling to the second spiral conductive trace.

10. The directional coupler of claim 8, further comprising:

a plurality of conductive trace wings extending from at least one of the outer terminus of the first spiral conductive trace, the outer terminus of the second spiral conductive trace, the first underpath, and the second underpath.

11. A directional coupler, comprising:

an input port;

an output port;

a coupled port;

a ballasting port;

a dielectric layer;

a first spiral conductive trace disposed on the dielectric layer, the first spiral conductive trace having a first predefined width and a first predefined thickness, and being defined by a outer terminus, a plurality of successively inward turns, and an inner terminus;

a second spiral conductive trace disposed on the dielectric layer and in an interlocking, spaced coplanar relationship with the first conductive trace and inductively coupled thereto, the second spiral conductive trace having a second predefined width and a second predefined thickness, and being defined by an outer terminus, a plurality of successively inward turns, and an inner terminus;

a first underpath formed on the dielectric layer connecting the inner terminus of the second spiral conductive trace to the ballasting port, the first underpath being capacitively coupled to at least one of the first spiral conductive trace and the second spiral conductive trace; and a second underpath formed on the dielectric layer connecting the inner terminus of the first spiral conductive trace to the output port, the second underpath being capacitively coupled to at least one of the first spiral conductive trace and the second spiral conductive trace.

12. The directional coupler of claim 11, wherein the dielectric layer is on a thin-film printed substrate.

13. The directional coupler of claim 11, further comprising one or more conductive circuit elements disposed on the dielectric layer for increasing capacitive coupling of the first spiral conductive trace to the second spiral conductive trace.

14. The directional coupler of claim 13, wherein the first predefined width of the first spiral conductive trace is greater than the second predefined width of the second spiral conductive trace.

15. The directional coupler of claim 13, wherein the first predefined thickness of the first spiral conductive trace is substantially equal to the second predefined thickness of the second spiral conductive trace.

16. The directional coupler of claim 13, wherein one of the conductive circuit elements is a capacitive stub connected to the coupled port and extending in a spaced parallel relationship to at least a part of the first spiral conductive trace.

17. The directional coupler of claim 14, wherein the capacitive stub is coplanar with the first underpath and the second underpath.

18. The directional coupler of claim 13, wherein the conductive circuit elements are secondary traces coplanar with the first underpath and the second underpath and disposed in a spaced, parallel and partially coextensive relationship with the first spiral conductive trace.

19. The directional coupler of claim 18, further comprising:

a plurality of stubs interposed between and electrically connecting the secondary traces and the first spiral conductive trace.

20. The directional coupler of claim 13, wherein the conductive circuit elements include a plurality of conductive trace wings extending from at least one of the outer terminus of the first spiral conductive trace, the outer terminus of the second spiral conductive trace, the first underpath, and the second underpath.

21. The directional coupler of claim 20, wherein thicknesses of the conductive trace wings are less than the first spiral conductive trace and the second spiral conductive trace.

22. The directional coupler of claim 20, wherein the first predefined width of the first spiral conductive trace is substantially equal to the second predefined width of the second spiral conductive trace.

23. The directional coupler of claim 11, wherein the dielectric layer is on a semiconductor substrate.

24. The directional coupler of claim 11, wherein the dielectric layer is on a low temperature co-fired ceramic (LTCC) substrate.

* * * * *